United States Patent [19]
Ribner

[11] Patent Number: 5,103,229
[45] Date of Patent: Apr. 7, 1992

[54] PLURAL-ORDER SIGMA-DELTA ANALOG-TO-DIGITAL CONVERTERS USING BOTH SINGLE-BIT AND MULTIPLE-BIT QUANTIZATION

[75] Inventor: David B. Ribner, Schenectady, N.Y.

[73] Assignee: General Electric Company, Schenectady, N.Y.

[21] Appl. No.: 513,452

[22] Filed: Apr. 23, 1990

[51] Int. Cl.$^5$ .................. H03M 3/02; H03M 3/04
[52] U.S. Cl. ................ 341/143; 341/200; 341/162
[58] Field of Search ............ 341/143, 126, 166–170, 341/200, 161, 162, 155; 375/27–34

[56] References Cited

U.S. PATENT DOCUMENTS

| | | | |
|---|---|---|---|
| 4,860,012 | 8/1989 | Rich et al. | 341/143 |
| 4,862,169 | 8/1989 | Van Bavel et al. | 341/143 |
| 4,876,542 | 10/1989 | Van Bavel et al. | 341/143 |
| 4,876,543 | 10/1989 | Van Bavel | 341/143 |

OTHER PUBLICATIONS

"A Use of Limit Cycle Oscillators to Obtain Robust Analog to Digital Converters", J. C. Candy, IEEE Transactions on Communications, vol. COM-22, No. 3, pp. 298–305, Mar. 1974.

"Using Triangularly Weighted Interpolation to Get 13-Bit PCM from a Sigma-Delta Modulator", J. C. Candy et al., IEEE Transactions on Communications, vol. CM-24, No. 11, pp. 1268–1275, Nov. 1976.

"A Use of Double Integration in Sigma Delta Modulation", J. C. Candy, IEEE Transactions on Communications, vol. COM-33, No. 3, pp. 249–258, Mar. 1985.

"A 16-Bit Oversampling A–D Conversion Technology Using Triple Integration Noise Shaping", IEEE Journal of Solid State Circuits, vol. SC-22, No. 6, pp. 921–929, Dec. 1987, Y. Matsuya et al.

"A 16-Bit 160 kHz CMOS A/D Converter Using Sigma-Delta Modulation", Proceedings 1988, Custom Integrated Circuits Conference, pp. 21.2.1–21.2.4, Jun. 1988, M. Rebeschini et al.

"A 13-Bit ISDN-Band ADC Using Two-Stage Third Order Noise Shaping", Proceedings 1988 Custom Integrated Circuit Conference, pp. 21.2.1–21.2.4, Jun. 1988, L. Longo and M. A. Copeland.

Primary Examiner—A. D. Pellinen
Assistant Examiner—Sharon D. Logan
Attorney, Agent, or Firm—Allen L. Limberg; James C. Davis, Jr.; Marvin Snyder

[57] ABSTRACT

An oversampling converter of a type using a plural-order, plural-stage sigma-delta modulator, the output signal to the decimating filter of which modulator has the quantization noise contribution of a number of its plurality of stages suppressed therein, uses single-bit quantization in those stages to help avoid problems of nonlinearity. Each other sigma-delta converter stage, the quantization noise of which appears in substantial amount in the converter output signal to the decimating filter, uses quantization having multiple-bit resolution to help increase the resolution of the oversampling converter overall.

29 Claims, 14 Drawing Sheets

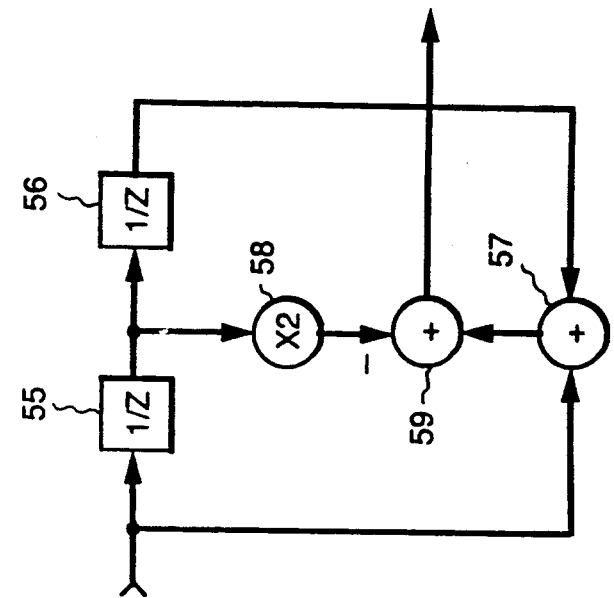
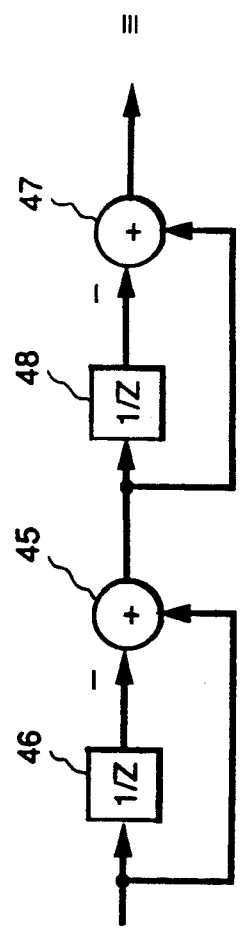
FIG. 14

PLURAL-ORDER SIGMA-DELTA ANALOG-TO-DIGITAL CONVERTERS USING BOTH SINGLE-BIT AND MULTIPLE-BIT QUANTIZATION

The invention relates to analog-to-digital converters (ADCs) and more particularly to ones of oversampling type which use plural-order sigma-delta modulators having plural feedback loops.

BACKGROUND OF THE INVENTION

Sigma-delta modulators (sometimes referred to as delta-sigma modulators) have been used in analog-to-digital converters for some time. The reader is referred to the following technical articles incorporated herein by reference.
1) "A Use of Limit Cycle Oscillators to Obtain Robust Analog to Digital Converters", J. C. Candy, IEEE TRANSACTIONS ON COMMUNICATIONS, Vol. COM-22, No. 3, pp. 298-305, March 1974
2) "Using Triangularly Weighted Interpolation to Get 13-Bit PCM from a Sigma-Delta Modulator", J. C. Candy, et al., IEEE TRANSACTIONS ON COMMUNICATIONS, Vol. COM-24, No. 11, pp. 1268-1275, November 1976
3) "A Use of Double Integration in Sigma Delta Modulation", J. C. Candy, IEEE TRANSACTIONS ON COMMUNICATIONS, Vol. COM-33, No. 3, pp. 249-258, March 1985

Substantial effort has been made by specialists in the field of oversampled converter design to develop plural-order sigma-delta modulators, so as to obtain higher resolution for a given oversampling ratio R. Inasfar as this specification is concerned, the order of a sigma-delta modulator stage corresponds to how many times the error between its output and input signals (including quantization noise) is integrated with respect to time in the overall feedback loop used for determining that error. A sigma-delta modulator stage supplies its output signal from a quantizer (or analog-to-digital converter) of the integrated error, which signal is converted to an analog signal by a digital-to-analog converter included together with the quantizer within the stage. The analog signal from the digital-to-analog converter is compared to the analog input signal to the sigma-delta modulator stage to generate the error signal that is integrated with respect to time in order to close the overall feedback loop. In a second-order sigma-delta modulator stage there is another feedback loop inside the overall feedback loop. In this other loop the output signal as converted to analog form is compared to the error between the output and input signals of the stage as once integrated, thereby to generate another error signal, which is further integrated to generate the input signal for the quantizer. The order of a sigma-delta converter, which converter includes cascaded sigma-delta modulator stages followed in cascaded by a decimating filter, is the sum of the orders of the cascaded sigma-delta modulator stages included therein.

The ordinal number of a sigma-delta modulator stage within a plural-stage sigma-delta converter, on the other hand, is determined directly by how many sigma-delta modulator stages the input signal to the converter must pass through to reach the output connection of that sigma-delta modulator stage.

Most sampled-data sigma-delta converters filter the quantization noise spectrum with a system function N(z) that is simply differentiation by discrete time —i.e., $N(z) = (1-z^{-1})^L$, where L refers to the order of the sigma-delta modulator. Customarily, sigma-delta converters provide what is referred to as "sinusoidal" shaping of quantization noise, wherein the quantization noise previous to shaping by convolution with N(z) is assumed to be white—i.e., to exhibit a broad-band flat response. This allows the output noise spectrum to be approximated by $$S_N(\omega T) = K_{QN}[2 \sin(\omega T/2)]^{2L},$$

where $K_{QN}$ is the power-spectral-density (PSD) of the unshaped quantization noise. The final noise, accompanying the response of the decimation filtering which follows the sigma-delta modulator, is determined by integrating $S_N(\omega T)$ over the baseband—i.e., from $\omega=0$ to $\omega = \pi/R$. Using this noise level, the theoretically attainable resolution, B, of a sigma-delta converter with the customary sinusoidal noise shaping can be expressed in terms of bits as follows:

$$B = (L+0.5) \log_2 R - \log_2[\pi^L(2L+1)^{-0.5}] + (P-1).$$

Resolution as so expressed increases by one bit per octave of oversampling for each integer increment in modulator order L.

The number of bits resolution obtained, B, is linearly related to P, the number of quantizer bits used in the sigma-delta modulator. It is desirable, then, to be able to use multiple-bit quantization in the sigma-delta modulator, in order to increase overall resolution in the oversampling converter. However, the accuracy of the digital-to-analog converter (DAC) in the quantizer must be consistent with the level of performance of the oversampled ADC after decimation, or else resolution is limited to less than that theoretically attainable.

To avoid the problems of nonlinearity in the DACs, the common practice is to use single-bit DACs after single-bit quantizers, or ADCs, in sigma-delta modulators. In such configurations errors in the two levels of DAC output can introduce gain errors or offset errors, or both. However, the linearity of the converter is never compromised since a straight line invariably will fit through just two points.

If one seeks to introduce a four-bit quantizer into a sigma-delta modulator, then the DAC used after the quantizer must respond to respective ones of the four-bit digital numbers from the quantizer to generate sixteen points of output signal level through which a straight line may thread without any point exhibiting more than a specified departure from the line. That specified departure is just smaller than one-half the increment (or decrement) in that four-bit quantizer output signal level which causes the smallest resolvable increment (or decrement) in the ultimate digital output signal of the complete converter. Otherwise, as known to those highly skilled in the art, the desired resolution of the converter will not be available in certain portions of the range of the analog input signal to the sigma-delta modulator (i.e., those portions of the range where points are most remote from the best-fitting straight line). Obtaining such accuracy from a DAC is difficult, even with trimming, tending to make a four-bit quantizer expensive to realize in the normal monolithic integrated circuit construction. Then, too, a four-bit quantizer takes up considerably more area on a monolithic integrated circuit die than a single-bit quantizer does.

In the context of a plural-order sigma-delta modulator, the plural use of four-bit quantizers compounds these shortcomings.

This observation leads to a consideration of oversampling converters having sinusoidal noise shaping which are of a type using a plural-order sigma-delta modulator in which only one or at most a few of the sigma-delta modulator stages incorporates a quantizer with multiple-bit resolution that is higher than the resolution of each quantizer in other of the sigma-delta modulator stages. This avoids multiplying the problems associated with using a quantizer with multiple-bit resolution.

SUMMARY OF THE INVENTION

The object of the invention is to provide oversampling converters having several bits of resolution and at the same time having good conversion linearity both in the incremental sense and in the overall sense.

The invention is embodied in certain oversampling converters of a type using a plural-order sigma-delta modulator with plural stages. The output signal to the decimating filter of the plural-order sigma-delta modulator has the quantization noise contribution of a number of its stages suppressed therein, and the modulator uses single-bit quantization in those stages to help avoid problems of nonlinearity. Each other sigma-delta converter stage, the quantization noise of which appears in substantial amount in the converter output signal to the decimating filter, uses quantization having multiple-bit resolution to help increase the resolution of the oversampling converter overall.

BRIEF DESCRIPTION OF THE DRAWING

Each of FIGS. 1 and 2 is a schematic diagram of a prototypical oversampling analog-to-digital converter comprising three first-order sigma-delta modulators arranged as first, second and third stages in a third-order sigma-delta modulator embodying the invention.

Each of FIGS. 3 and 4 is a schematic diagram of a prototypical oversampling analog-to-digital converter comprising a second-order sigma-delta modulator and a first-order sigma-delta modulator arranged as initial and final stages in a third-order sigma-delta modulator embodying the invention.

FIG. 14 is a schematic diagram of an equivalency of digital circuits for performing second derivative with respect to time, which equivalency may be exploited to modify the oversampling analog-to-digital converters of FIGS. 1-8 thereby to generate other embodiments of the invention.

DETAILED DESCRIPTION

Figure 1:
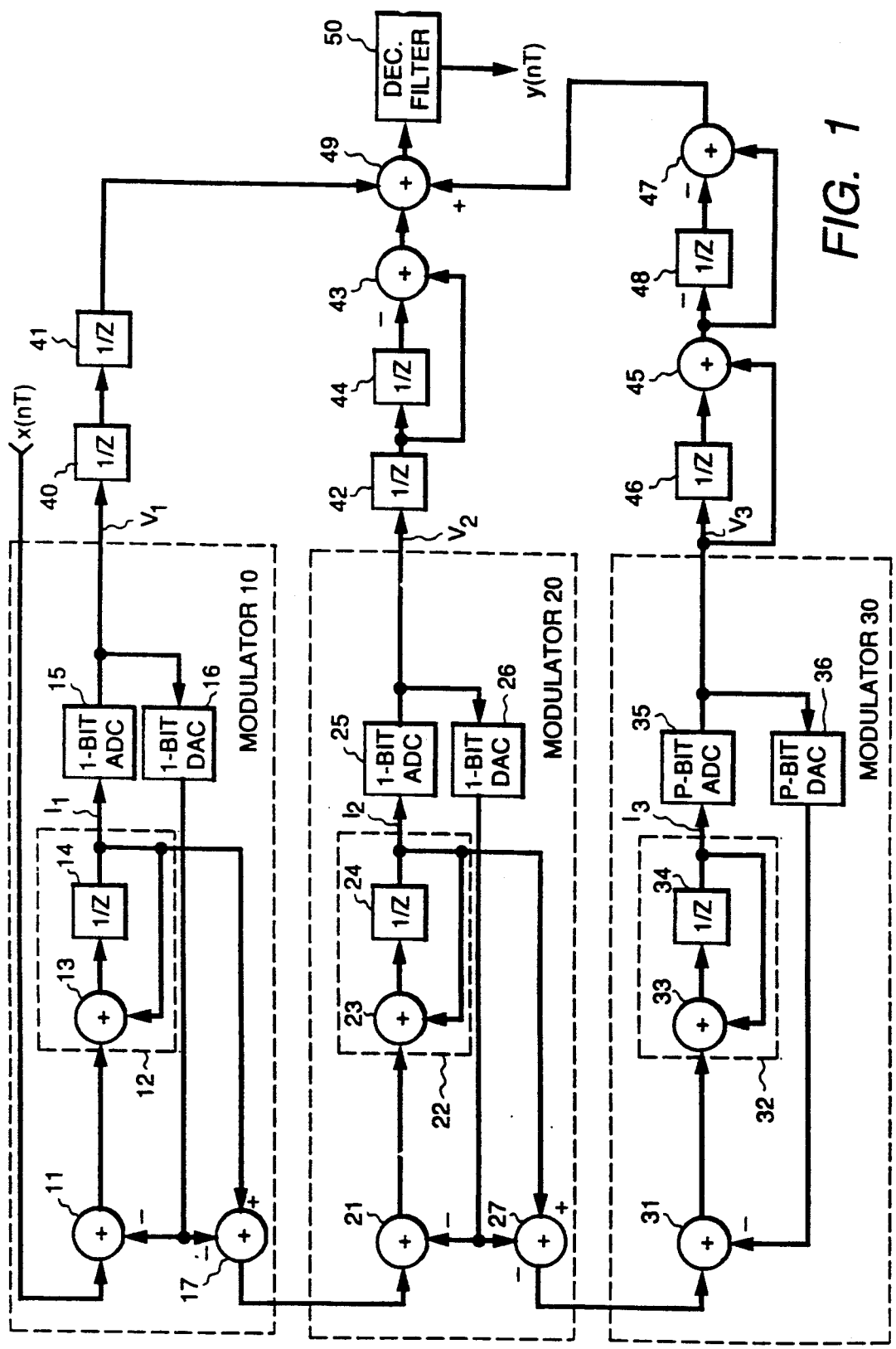

The FIG. 1 oversampling converter has circuit topology similar to that described by Y. Matsuya et al. in their paper "A 16-bit oversampling A-D conversion technology using triple integration noise shaping", IEEE JOURNAL OF SOLID STATE CIRCUITS, Vol. SC-22, No. 6, pp. 921-929, Dec. 1987. The plural-order sigma-delta modulator portion of the FIG. 1 oversampling analog-to-digital modulator generates a sampled-data digital response y(nT) to a sampled-data input voltage x(nT), which response is supplied to a decimation filter 50 that provides the ultimate analog-to-digital conversion result. The plural-order sigma-delta modulator portion of the FIG. 1 modulator includes a first first-order sigma-delta modulator stage 10, a second first-order sigma-delta modulator stage 20 and a third first-order sigma-delta modulator stage 30.

The first sigma-delta modulator stage 10 includes an analog subtractor 11 to which the analog sampled-data input voltage x(nT) is supplied as minuend input signal. Subtractor 11 is supplied a first analog feedback signal voltage as subtrahend input signal. The resulting difference output signal from subtractor 11 is a first error signal, which is integrated respective to time in a first integrator 12 to generate a first integrator output voltage $I_1$. In FIG. 1 this first integrator 12 comprises an analog adder 13 and a one-cycle delay element 14. The integrator 12 output voltage $I_1$ is digitized in an analog-to-digital converter 15 to generate a digital output voltage $V_1$ for the first sigma-delta modulator stage 10 that corresponds to the sampled-data analog input signal x(nT), as subjected to unit clock delay. A digital-to-analog converter 16 converts the ADC 15 output voltage $V_1$ to analog form, to generate the first analog feedback signal voltage, supplied to subtractor 11 as subtrahend input signal for completing a first feedback loop. The first analog feedback signal voltage from DAC 16 is also supplied to another analog subtractor 17 as its subtrahend input signal. Subtractor 17 receives as its minuend input voltage the first integrator output voltage $I_1$. Subtractor 17 generates a difference signal that corresponds to the negative of the quantization noise of the first sigma-delta modulator stage 10 and is used as input signal voltage for the second sigma-delta modulator stage 20.

The second sigma-delta modulator stage 20 includes an analog substractor 21 receiving, as its minuend signal, the negative of quantization noise of the first sigma-delta modulator stage 10. Subtractor 21 is supplied the analog feedback signal voltage of the second sigma-delta modulator stage 20 as subtrahend input signal. The resulting difference output signal from subtractor 23 is a second error signal, which is integrated respective to time in a second integrator 22 to generate a second integrator output voltage $I_2$. In FIG. 1 this second integrator 22 comprises an analog adder 23 and a one-cycle delay element 24. The integrator 22 output voltage $I_2$ is digitized in an analog-to-digital converter 25 to generate a digital output voltage $V_2$ for the second sigma-delta modulator stage 20 that corresponds to the negative of the quantization noise of the first sigma-delta modulator stage 10, as subjected to unit clock delay. A digital-to-analog converter 26 converts the ADC 25 output voltage to analog form, to generate the second analog feedback signal voltage, supplied to subtractor 21 as subtrahend input signal for completing a second feedback loop. The second analog feedback signal voltage is also supplied to another analog subtractor 27 as its subtrahend input signal. Subtractor 27 receives as its minuend input voltage the second integrator 22 output voltage $I_2$ and generates a difference signal that corresponds to the negative of the quantization noise of the second sigma-delta modulator stage 20 and is used as input signal voltage for the third sigma-delta modulator stage 30.

The third sigma-delta modulator stage 30 includes an analog subtractor 31 receiving, as its minuend input signal, the negative of the quantization noise of the second sigma-delta modulator stage 20. Subtractor 31 is supplied the analog feedback signal voltage of the third sigma-delta modulator stage 30 as subtrahend input signal. The resulting difference output signal from subtractor 31 is a third error signal, which is integrated respective to time in a third integrator 32 to generate a third integrator output voltage $I_3$. In FIG. 1 this third integrator 32 comprises an analog adder 33 and a one-cycle delay element 34. The integrator 32 output voltage $I_3$ is digitized in an analog-to-digital converter 35 to generate a digital output voltage $V_3$ for the third sigma-delta modulator stage 30 that corresponds to the negative of the quantization noise of the second sigma-delta modulator stage 20, as subjected to unit clock delay. A digital-to-analog converter 36 converts the ADC 35 output voltage $V_3$ to analog form to be supplied to subtractor 31 as its subtrahend input signal thus completing a third feedback loop.

The $V_2$ output voltage samples of the second sigma-delta modulator stage 20 and the $V_3$ output voltage samples of the third sigma-delta modulator stage 30 are digitally differentiated once and twice, respectively, before they and the $V_1$ output voltage samples of the first sigma-delta modulator stage 10 are added with suitable offset delays to provide the input signal for the decimation filter 50 that provides the ultimate analog-to-digital conversion result. The resulting sampled-data digital response in the time domain, in terms of a unit time period of T, is:

$$y(n) = x(n-3) + e_3(n) - 3e_3(n-1) + 3e_3(n-2) - e_3(n-3);$$

and the sampled-data digital response in the corresponding frequency domain is:

$$Y(z) = z^{-3}X(z) + (1-z^{-1})^3 E_3(z)$$

where $e_3$ is the quantization noise error of the third sigma-delta modulator stage 30 in the time domain, z is the discrete time frequency variable and $E_3$ is the quantization noise error of the third sigma-delta modulator stage 30 in the frequency domain. The third-order noise shaping arises from the cancellation of the first sigma-delta modulator stage 10 quantization noise using the second sigma-delta modulator stage 20 and from the cancellation of the second sigma-delta modulator stage 20 quantization noise using the third sigma-delta modulator stage 30. Component matching errors and limitations on the open-loop gains of integrators 12, 22 and 32 prevent these cancellations from being perfect in actual practice, of course, and leak first- and second-order-shaped noise into the Y(z) output voltage samples to cause a reduction in signal-to-noise ratio.

As particularly shown in FIG. 1, the $V_1$ output voltage samples of the first sigma-delta modulator stage 10 is delayed two sample times in cascaded one-sample digital delay elements 40 and 41, and the $V_2$ output voltage samples of the second sigma-delta modulator stage 20 are delayed one sample time in a one-sample digital delay element 42. The one-sample digital delay element 40 delays $V_1$ to compensate for the delay in $V_2$ introduced by the one-sample analog delay element 24 in the second sigma-delta modulator stage 20 integrator; and the one-sample digital delay elements 41 and 42 delay $V_1$ and $V_2$ to compensate for the delay in $V_3$ introduced by the one-sample analog delay element 34 in the third sigma-delta modulator stage 30 integrator. The differential with respect to time of the delayed $V_2$ output voltage samples of the second sigma-delta modulator stage 20 is taken by the differentiator comprising a digital subtractor 43 and a one-sample digital delay element 44. The first differential with respect to time of the $V_3$ output voltage samples of the third sigma-delta modulator stage 30 is taken by the differentiator comprising a digital subtractor 45 and a one-sample digital delay element 46. The first differential with respect to time of subtractor 45 difference output signal, which is the second differential with respect to time of the $V_3$ output voltage samples, is taken by the differentiator comprising a digital subtractor 47 and a one-sample digital delay element 48. The twice-delayed $V_1$ output voltage samples, the differentiated delayed $V_2$ output voltage samples, and the twice-differentiated $V_3$ output voltage samples are combined in a digital adder 49. In digital adder 49, the quantization noise of the first sigma-delta modulator stage 10 supplied via one-sample digital delay elements 40 and 41 is cancelled by the negative of the quantization noise of the first sigma-delta modulator stage 10 as digitized by the second sigma-delta modulator stage 20 and subsequently differentiated by elements 43, 44; and the quantization noise of the second sigma-delta modulator stage 20 as delayed by one-sample digital delay element 42 and subsequently differentiated by elements 43, 44 is cancelled by the negative of the quantization noise of the second sigma-delta modulator stage 20 as digitized by the third sigma-delta modulator stage 30 and subsequently twice differentiated by elements 46-48. This leaves only X(t), as delayed three sample times, and twice-differentiated quantization noise from the third sigma-delta modulator stage 30 as components of the output signal supplied by digital adder 49 to the decimating filter 50 of the FIG. 1 analog-to-digital converter.

The analog integrators 12, 22 and 32 may, for example, each be realized as a switched capacitor integrator as described by R. Gregorian and G. C. Temes on pages 270-280 of their book "Analog MOS Integrated Circuits for Signal Processing" published in 1986 by John Wiley & Sons of New York. A one-sample digital delay element for digital signal may be provided by applying each bit of the digital signal to a respective flip-flop of the data or "D" type, for example.

In accordance with the invention, analog-to-digital converters 15 and 25 can have single-bit resolution and digital-to-analog converters 16 and 26 can be single-bit DACs without any substantial adverse affect on the resolution of the FIG. 1 oversampling converter, because the quantization noise of the first sigma-delta modulator stage 10 and the quantization noise of the second sigma-delta modulator stage 20 do not appear in any substantial amount in the signal supplied to the decimation filter 50. Errors in the two levels of DAC output of digital-to-analog converter 16 or 26 can introduce gain errors or offset errors, or both. But such errors cannot compromise the linearity of the converter, since a straight line invariably will fit through just two points. Also in accordance with the invention, analog-to-digital converter 35 has P-bit resolution, where P is an integer at least two, such as four, and digital-to-analog converter 36 is accordingly a P-bit DAC. Since ideally Y(z) has only $(1-z^{-1})^3 E_3(z)$ attendant quantization noise, the bit resolution of the analog-to-digital converter 35 and the digital-to analog converter 36 in the third sigma-delta modulator stage 30 is a primary determinant of the resolution of the FIG. 1 oversampling converter.

Certain variants of the FIG. 1 converter will be apparent to one skilled in the art of electronic circuit design. Digital subtractor 43 may be of a type which exhibits one-cycle delay in its operation, allowing the one-sample digital delay element 42 to be subsumed within subtractor 43 instead of appearing as a separate element. Alternatively, digital adder 49 may comprise a cascade of two-input digital adders, the first of which adds $V_1$ as delayed by one sample time by delay element 40 and $V_2$ to provide their sum one sample time later, allowing the one-sample digital delay elements 41 and 42 both to be subsumed within adder 49 instead of appearing as separate elements.

The sign of additions in digital adder 49 can be altered to suit reversals of the minuend and subtrahend connections of either or both analog subtractor 17 and analog subtractor 27. Since the analog subtractors 17 and 27 are generally realized by switched-capacitance methods, modifying the ways in which the capacitors are switched provides for the reversals of the minuend and subtrahend connections. Either or each of the analog subtractors 21 and 31 may be replaced by a respective circuit that provides the negative sum of its input signals, with suitable changes being made in the analog subtractors 17 and 27 or in the adder 49. The linear combination of $V_1$, once-differentiated $V_2$, and twice-differentiated $V_3$ can be carried out in a variety of addition/subtraction trees or ladders or combinations thereof.

As shown in FIG. 14, the double-differentiation with respect to time need not be done by successive differentiations, first using elements 45 and 46 and then using elements 47 and 48. Rather, it may be done using a tapped delay line structure comprising one-sample digital-delay elements 55 and 56 to obtain the current sample $V_3$ and the previous two samples $z^{-1}V_3$ and $z^{-2}V_3$, summing $V_3$ and $z^{-2}V_3$ in a digital adder 57 to obtain $V_3+z^{-2}V_3$, multiplying $z^{-1}V_3$ by two in a bit-place shifter 58 to obtain $2\,z^{-1}V_3$, and subtracting $2\,z^{-1}V_3$ from $V_3+z^{-2}V_3$ in a digital subtractor 59 to obtain $V_3-2\,z^{-1}V_3+z^{-2}V_3$, which factors to $(1-z^{-1})^2 V_3$, the same transfer function as for the double-differentiation with respect to time done by successive differentiations.

Figure 2:
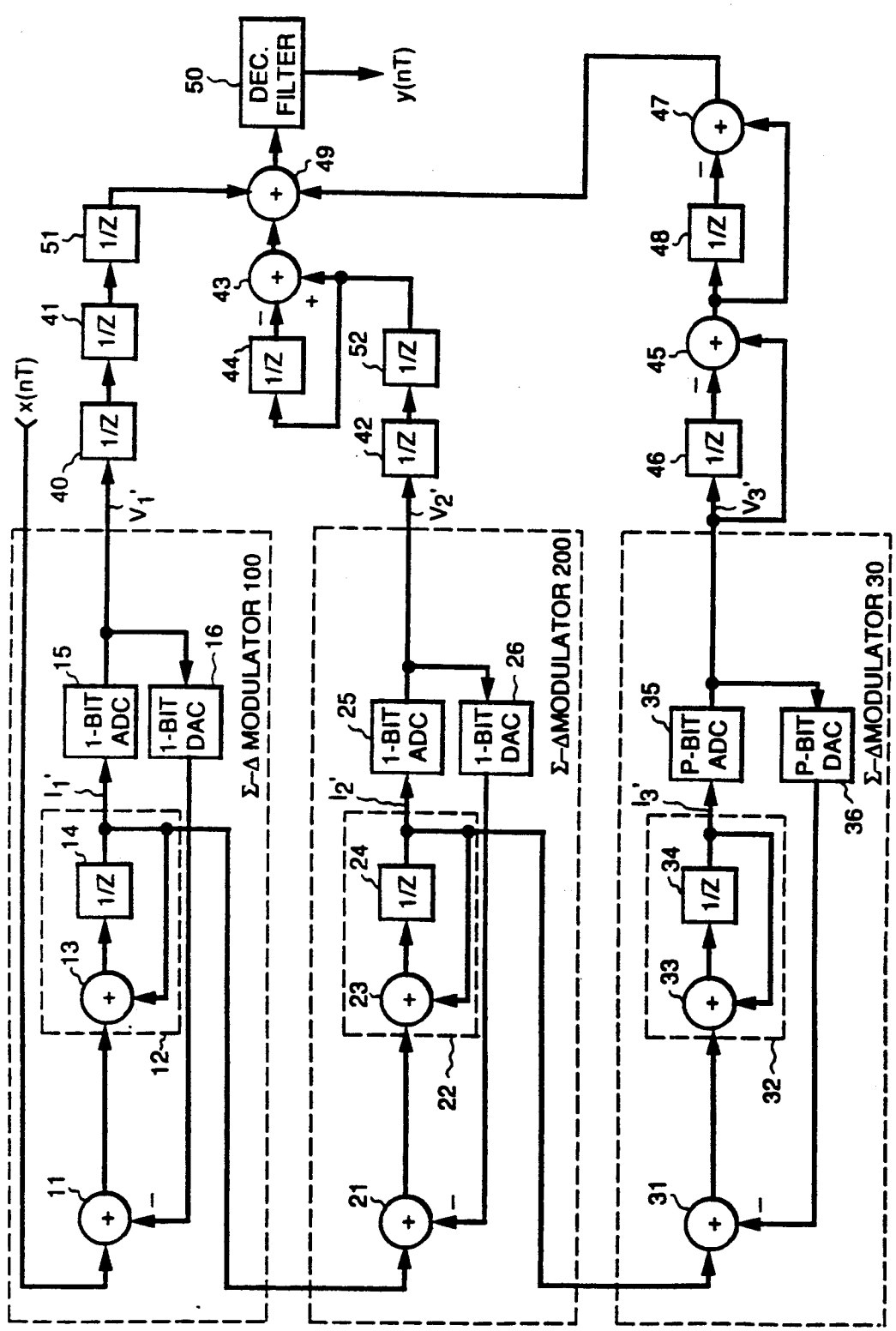

The FIG. 2 oversampling analog-to-digital converter has circuit topology similar to that described by M. Rebeschini et al. in their paper "A 16-bit 160 kHz CMOS A/D Converter Using Sigma-Delta Modulation", PROCEEDINGS 1988 CUSTOM INTEGRATED CIRCUITS CONFERENCE, pp. 21.2.1–4, June 1988. The FIG. 2 oversampling analog-to-digital converter differs from the FIG. 1 oversampling analog-to-digital converter in that only the quantizer (ADC) input signal is fed from one stage to the next, rather than feeding the quantization noise from one stage to the next. A quantizer (ADC) input signal is the analog signal corresponding to the digital output signal at the output connection of the quantizer, less the quantization noise introduced by conversion through the quantizer.

The output voltage of the first modulator stage 100 has the following value:

$$V_1 = z^{-1}X(z) + (1-z^{-1})E_1(z).$$

so the input voltage of the second modulator stage 200 has the following value:

$$V_1 - E_1(z) = z^{-1}X(z) - z^{-1}E_1(z).$$

The output voltage of the second modulator stage 200 then has the following value:

$$V_2' = z^{-2}X(z) - z^{-2}E_1(z) + (1-z^{-1})E_2(z).$$

so the input voltage of the third modulator stage 30 has the following value:

$$V_2' - E_2(z) = z^{-2}X(z) - z^{-2}E_1(z) - z^{-1}E_2(z).$$

(In this specification the use of primes on voltages taken from points in one oversampling converter is to distinguish them from other voltages taken from similar points in another oversampling converter. The prime does not indicate the derivative of the mathematical expression that is primed.)

The output voltage of the third modulator stage 30 then has the following value:

$$V_3' = z^{-3}X(z) - z^{-3}E_1(z) - z^{-2}E_2(z) + (1-z^{-1})E_3(z).$$

$V_1$ is delayed by three cycles in delay elements 40, 41 and 51 to obtain the voltage:

$$z^{-3}V_1 = z^{-4}X(z) - z^{-4}E_1(z) + z^{-3}E_1(z).$$

$V_2'$ is delayed by two cycles in delay elements 42 and 52, then is differentiated by elements 43 and 44 to obtain the voltage:

$$z^{-2}(1-z^{-1})\,V_2' = z^{-4}X(z) - z^{-4}E_1(z) - 2z^{-3}E_2(z) \\ + z^{-2}E_2(z) - z^{-5}X(z) + z^{-5}E_1(z) + z^{5}E_1(z)$$

$V_3'$ is differentiated a first time by elements 45 and 46 and then a second time by elements 47 and 48 to obtain the voltage:

$$(1-z^{-1})^2 V_3' = z^{-3} X(z) - z^{-3} E_1(z) - z^{-2} E_2(z) - \\ 3 z^{-1} E_3(z) + E_3(z) - 2 z^{-4} X(z) + 2 z^{-4} E_1(z) + \\ 2 z^{-3} E_2(z) + 3 z^{-2} E_3(z) + z^{-5} X(z) - z^{-5} E_1(z) - \\ z^{-4} E_2(z) - z^{-3} E_3(z).$$

Y(z), which corresponds to the sum signal from digital adder 49, is then:

$$Y(z) = z^{-2} V_1 - z^{-2}(1 - z^{-1}) V_2 - (1 - z^{-1})^2 V_3'$$
$$= z^{-3} X(z) - E_3(z) - 3z^{-1} E_3(z) - 3z^{-2} E_3(z) - z^{-3} E_3(z)$$
$$= z^{-3} X(z) - (1 - z^{-1})^3 E_3(z).$$

In the corresponding time domain, in terms of a unit time period of T, the sampled-data digital response of the FIG. 2 oversampling analog-to-digital converter is:

$$y(n) = x(n-3) + e_3(n) - 3e_3(n-1) + 3e_3(n-2) - e_3(n-3);$$

where, as previously, $e_3$ is the quantization noise error of the third sigma-delta modulator stage 30 in the time domain, z is the discrete time frequency variable, and $E_3$ is the quantization noise error of the third sigma-delta modulator stage 30 in the frequency domain. As in the FIG. 1 oversampling analog-to-digital converter, component matching errors and limitations on the open-loop gains of integrators 12, 22 and 32 permit some first- and second-order-shaped noise to leak into the Y(z) output voltage samples to cause a reduction in signal-to-distortion ratio.

In the FIG. 2 converter, as in the FIG. 1 converter, in accordance with the invention analog-to-digital converter 15 and digital-to-analog converter 16 have single-bit resolution, so as not to compromise the linearity of the FIG. 2 converter, which is possible because the quantization noise from the first sigma-delta modulator stage 100 does not appear in substantial amount in the signal supplied to the decimation filter 50. Furthermore, in accordance with the invention analog-to-digital converter 25 and digital-to-analog converter 26 also have single-bit resolution, so as not to comprise the linearity of the FIG. 2 converter, which is possible because the quantization noise from the second sigma-delta modulator stage 200 does not appear in substantial amount in the signal supplied to the decimation filter 50. Also in accordance with the invention, analog-to-digital converter 35 has P-bit resolution, where P is an integer at least two, such as four, and digital-to-analog converter 36 is accordingly a P-bit DAC. Again, since ideally Y(z) has only $(1-z^{-1})^3 E_3(z)$ attendant quantization noise, the bit resolution of the analog-to-digital converter 35 and the digital-to-analog converter 36 in the third sigma-delta modulator stage 30 is a primary determinant of the resolution of the FIG. 2 oversampling converter.

Figure 3:
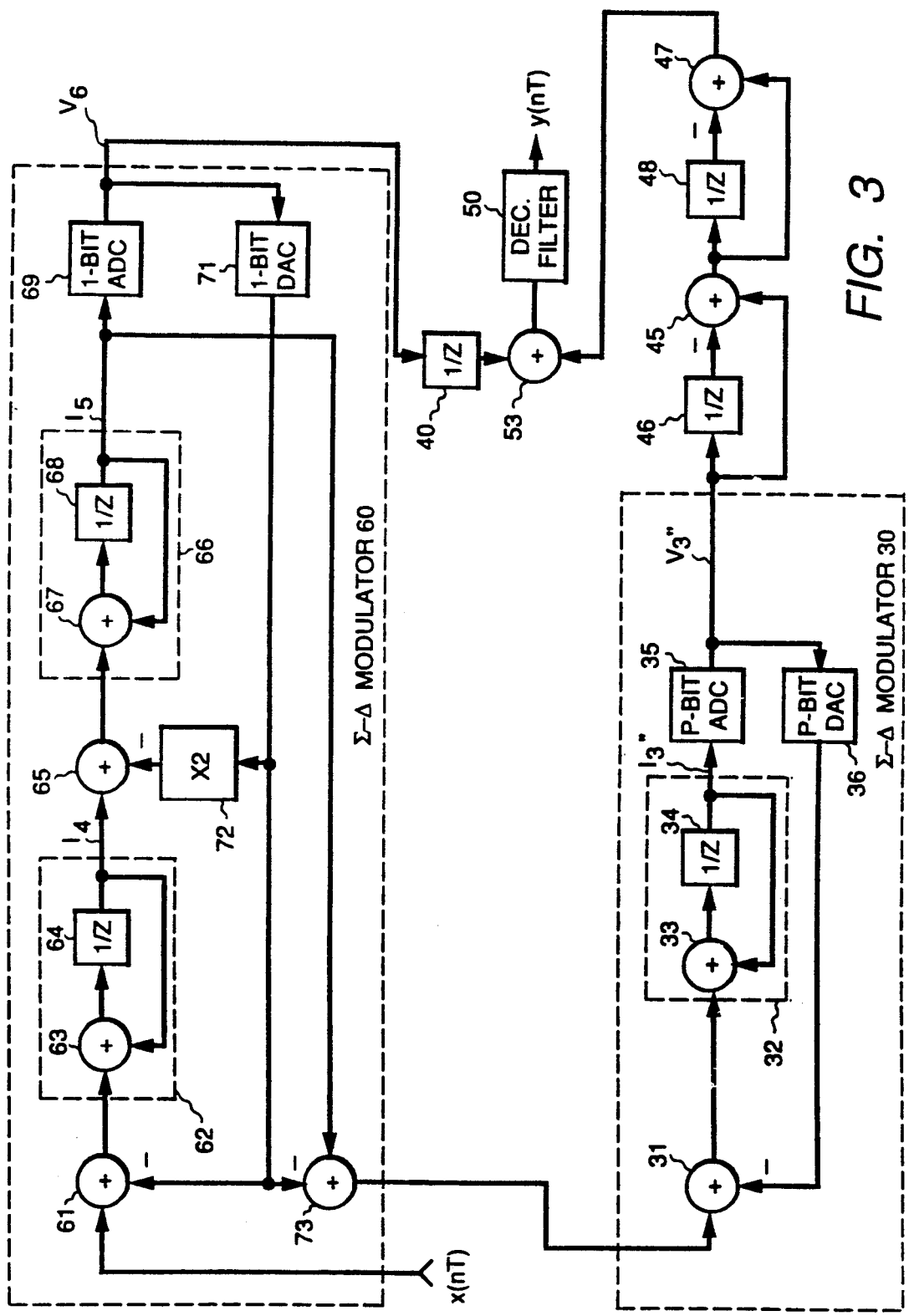

The FIG. 3 oversampling analog-to-digital converter has circuit topology similar to that described by L. Longo and M. A. Copeland in their paper "A 13-bit ISDN-band ADC using two-stage third order noise shaping", PROCEEDINGS 1988 CUSTOM INTEGRATED CIRCUIT CONFERENCE, pp. 21.2.1-4, June 1988. To reduce the component matching requirements and the required integrator gains through the sigma-delta modulator stages, which compromise the bit resolution available from the FIG. 1 and FIG. 2 converters, only two cascaded stages are used, the initial one of which is a second-order sigma-delta modulator stage 60. The quantization noise of the initial, second-order sigma-delta modulator stage 60 is supplied to the final, first-order sigma-delta modulator stage 30 with its own feedback loop. The quantization noise of the final, first-order sigma-delta modulator stage 30 is differentiated twice respective to time to generate a signal that cancels the quantization noise of the initial, second-order sigma-delta modulator stage 60 and thus provides for the third-order noise shaping.

More particularly, the second-order sigma-delta modulator stage 60 includes an analog subtractor 61 receiving the analog sampled-data input voltage x(nT) as minuend input signal. Subtractor 61 receives the "outside loop" feedback signal in the second-order sigma-delta modulator stage 60 as subtrahend input signal. The resulting difference output signal from subtractor 61 is a first error signal. The first error signal is integrated respective to time in a first integrator 62 comprising an analog adder 63 and a one-sample analog delay element 64 to generate a first integrator output voltage $I_4$ applied to an analog subtractor 65 as minuend input signal. Subtractor 65 receives the "inside loop" feedback signal in the second-order sigma-delta modulator stage 60 as subtrahend input signal. The resulting difference output signal from subtractor 65 is integrated respective to time in a second integrator 66 comprising an analog adder 67 and a one-sample analog delay element 68 to generate a second integrator output voltage $I_5$. The quantization noise of the sigma-delta modulator stage 60 is twice-integrated, which is the reason for referring to the sigma-delta modulator stage 60 as being second-order. An analog-to-digital converter 69 converts the second integrator 66 output voltage $I_5$ to the digital output voltage $V_6$ of the second-order sigma-delta modulator stage 60. The digital-to-analog converter 71 converts $V_6$ digital signal from ADC 69 to analog form to be used in the "outside loop" feedback applied to subtractor 61, to be multiplied by two in an analog scaling element 72 and then used in the "inside loop" feedback applied to subtractor 65, and to have $I_5$ subtractively combined therewith in an analog subtractor 73. Analog subtractor 73 generates a difference signal that corresponds to the quantization noise of the second-order sigma-delta modulator stage 60 and provides input signal voltage for the final sigma-delta modulator stage 30.

The output response $V_6$ of the modulator stage 60 is then as follows.

$$V_6 = z^{-2} X(z) + (1-z^{-1})^2 E_6(z).$$

The $V_3$ output voltage samples of the final, first-order sigma-delta modulator stage 30 are digitally differentiated twice by elements 46–49, and the $V_6$ output voltage samples of the initial, second-order sigma-delta modulator stage 60 are provided with suitable offset delay by one-sample digital delay element 40 before adding them to the twice-differentiated $V_3$ output voltage samples in a digital adder 53 to provide the input signal for the decimation filter 50 that provides the ultimate analog-to-digital conversion result.

In the time domain, in terms of a unit time period of T, the sampled-data digital response of the FIG. 3 plural-order sigma-delta modulator is:

$$y(n) = x(n-3) + e_3(n) - 3e_3(n-1) + 3e_3(n-2) - e_3(n-3);$$

and the sampled-data digital response in the corresponding frequency domain is:

$$Y(z) = z^{-3} X(z) + (1-z^{-1})^3 E_3(z)$$

where $e_3$ is the quantization noise error of the sigma-delta modulator stage 30 in the time domain, z is the discrete time frequency variable and $E_3$ is the quantization noise error of the sigma-delta modulator stage 30 in the frequency domain.

Theoretically, then, the response of the FIG. 3 oversampling converter is the same as that of the FIG. 1 oversampling converter, with only the thrice-differentiated quantization noise of the final sigma delta stage 30 contaminating the desired X(z) response. The advantage of the FIG. 3 converter over the FIG. 1 converter is that the noise at the output of the second-order sigma-delta modulator 60 already has second-order shaping, so mismatches of component values and limitations on open-loop gains of integrators 62, 66 and 32 can result only in leakage of second-order noise through the subsequent sigma-delta modulator 30.

In accordance with the invention analog-to-digital converter 69 can have single-bit resolution and digital-to-analog converter 71 can be a single-bit DAC without any substantial adverse affect on the resolution of the FIG. 3 oversampling converter, because the quantization noise of the initial sigma-delta modulator stage 60 does not appear in any substantial amount in the signal supplied to the decimation filter 50. Errors in the two levels of DAC output of digital-to-analog converter 71 can introduce gain errors or offset errors, or both, but such errors cannot compromise the linearity of the converter. Also in accordance with the invention, analog-to-digital converter 35 has P-bit resolution, where P is an integer at least two, such as four, and digital-to-analog converter 36 is accordingly a P-bit DAC. Since ideally Y(z) has only $(1-z^{-1})^3 E_3(z)$ attendant quantization noise, the bit resolution of the analog-to-digital converter 35 and the digital-to analog converter 36 in the final sigma-delta modulator stage 30 is a primary determinant of the resolution of the FIG. 3 oversampling converter.

In a variant of the FIG. 3 converter, the subtrahend and minuend inputs of analog subtractor 73 are reversed and digital adder 53 is replaced by a digital subtractor that subtracts $V_3'''$ from $V_6$ as delayed by one sample time by element 40.

Figure 4:
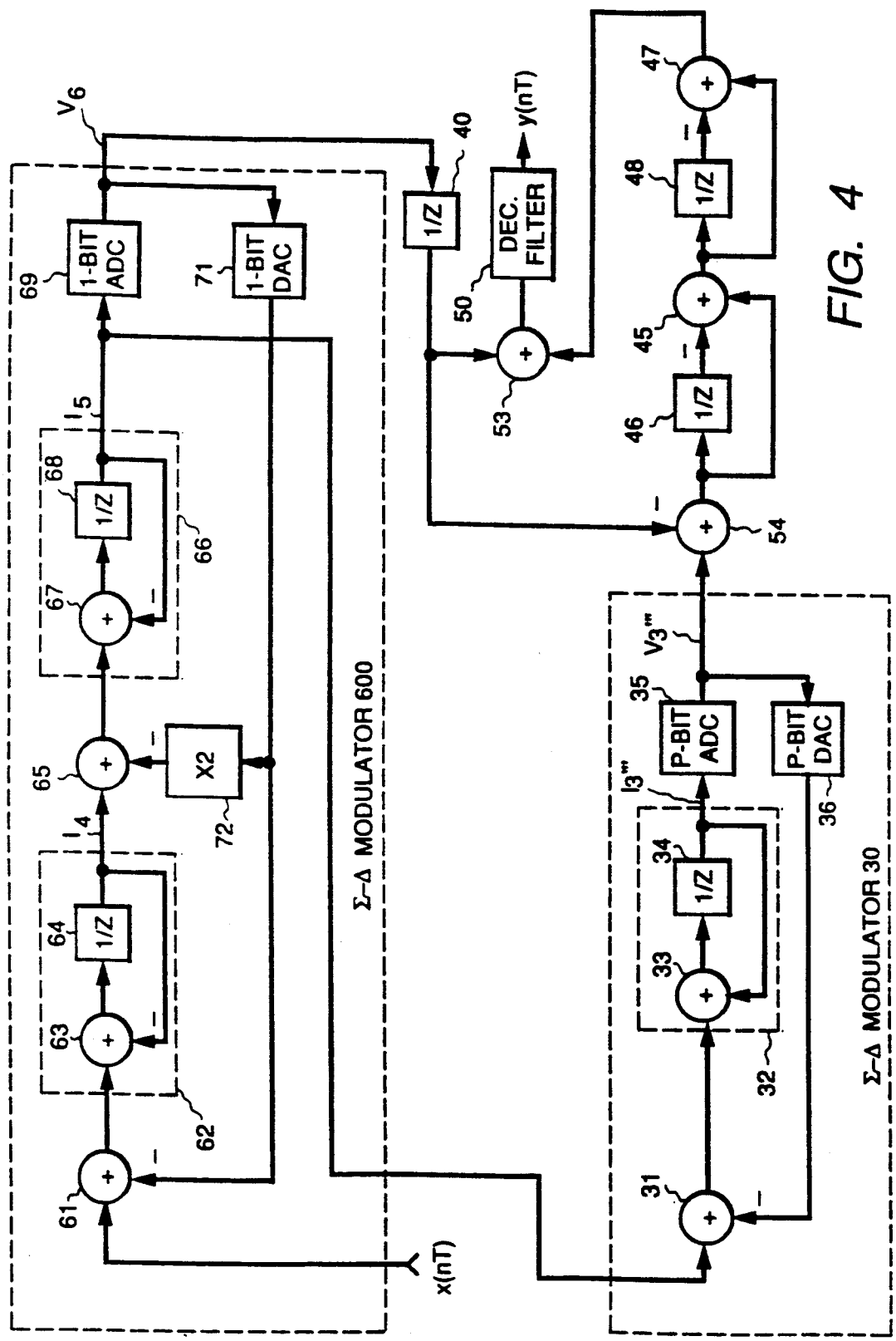

The FIG. 4 oversampling analog-to-digital converter differs from the FIG. 3 oversampling analog-to-digital converter in that it feeds the second integrator 66 output voltage $I_5$ of the initial, second-order sigma-delta modulator stage 600, rather than its quantization noise, to the final, first-order sigma-delta modulator stage 30. The FIG. 4 oversampling analog-to-digital converter also combines the digital output signals $V_6$ and $V_3'''$ of the initial and final sigma-delta modulators in a different way.

As noted above, the output signal $V_6$ (z) of the second-order sigma-delta modulator stage 60 or 600 has the following value.

$$V_6(z) = z^{-2}X(z) + (1-z^{-1})^2 E_6(z).$$

The second integrator output voltage $I_5$ differs from $V_6$ by the quantization noise $E_6(z)$ of analog-to-digital converter 69 and has the following value.

$$I_5 = V_6(z) - E_6(z) = z^{-2}X(z) - 2z^{-1}E_6(z) + z^{-2}E_6(z).$$

The second integrator output voltage $I_5$ applied as input signal to the final, first-order sigma-delta modulator stage 30 causes the following response.

$$V_3'''(z) = z^{-1}[z^{-2}X(z) - 2z^{-1}E_6(z) + z^{-2}E_6(z)] + (1-z^{-1})E_3(z).$$

Subtracting $V_6$, after its delay by one sample time in a digital delay element 40, from $V_3'''$ in a digital subtractor 54, the following response is obtained as a difference output signal.

$$\begin{aligned}
D_{54} &= V_3'''(z) - z^{-1} V_6(z) \\
&= z^{-1}[z^{-2}X(z) - 2z^{-1}E_6(z) + z^{-2}E_6(z)] + \\
&\quad (1-z^{-1})E_3(z) - z^{-1}[z^{-2}X(z) + \\
&\quad (1-z^{-1})^2 E_6(z)] \\
&= z^{-3}X(z) - 2z^{-2}E_6(z) + z^{-3}E_6(z) + \\
&\quad (1-z^{-1})E_3(z) - z^{-3}X(z) - z^{-1}E_6(z) + \\
&\quad 2z^{-2}E_6(z) - z^{-3}E_6(z) \\
&= -z^{-1}E_6(z) + (1-z^{-1})E_3(z).
\end{aligned}$$

The difference output signal $D_{54}$ is then twice differentiated with respect to time using elements 46-49 before being added in the adder 53 to $z^{-1}V_6(z)$ supplied from one-sample digital delay element 40, to generate the following Y(z) response.

$$\begin{aligned}
Y(z) &= (1-z^{-1})^2[-z^{-1}E_6(z) + (1-z^{-1})E_3(z)] + \\
&\quad z^{-1}[z^{-2}X(z) + (1-z^{-1})^2 E_6(z)] \\
&= z^{-3}X(z) + (1-z^{-1})^3 E_3(z)
\end{aligned}$$

Note particularly the cancellation of the opposite-polarity $z^{-1}(1-z^{-1})^2 E_6(z)$ terms, which essentially removes the second-order sigma-delta modulator stage 600 quantization noise from the Y(z) response in the frequency domain to leave only the thrice-differentiated quantization noise of the first-order sigma-delta modulator stage 30 as a contaminant of the desired delayed X(z) response.

In the corresponding time domain, in terms of a unit time period of T, the sampled-data digital signal supplied from the FIG. 4 oversampling analog-to-digital converter ideally is:

$$y(n) = x(n-3) + e_3(n) - 3e_3(n-1) + 3e_3(n-2) - e_3(n-3).$$

In accordance with the invention analog-to-digital converter can have single-bit resolution and digital-to-analog converter 71 can be a single-bit DAC without any substantial adverse affect on the resolution of the FIG. 4 oversampling converter, because the quantization noise of the initial sigma-delta modulator stage 600 does not appear in any substantial amount in the signal supplied to the decimation filter 50. Errors in the two levels of DAC output of digital-to-analog converter 71 can introduce gain errors or offset errors, or both, but such errors cannot compromise the linearity of the converter. Also in accordance with the invention, analog-to-digital converter 35 has P-bit resolution, where P is an integer at least two, such as four, and digital-to-analog converter 36 is accordingly a P-bit DAC. Since ideally Y(z) has only $(1-z^{-1})^3 E_3(z)$ attendant quantization noise, the bit resolution of the analog-to-digital converter 35 and the digital-to analog converter 36 in the final sigma-delta modulator stage 30 is a primary determinant of the resolution of the FIG. 4 oversampling converter.

The oversampling converter prototypes shown in FIGS. 1-4 are departed from in actual practice, to avoid problems associated with the tendency towards overlarge responses from integrators 12, 22, 62 and 66. Where the integrators include an operational amplifier connected as a Miller integrator which operational amplifier is operated within an output voltage range that is restricted to a similar range of voltage, overlarge responses from integrators 12, 22, 32, 62 and 66 will have undesirable linearities arising within each of the integrators itself. Overlarge integrator responses also tend to exceed the range of acceptable input voltage for the succeeding sigma-delta modulator stage, leading to undesirable nonlinearity of integration in the succeeding sigma-delta modulator stage and thus to a departure from prototypical operation. Accordingly, in practice, modifications of the oversampling converters shown in FIGS. 1–4 are made to reduce integrator gain, particularly in integrators 12, 22, 62 and 66. Reducing integrator gain by half is generally sufficient to keep the integrator responses within desired range. Modifications to reduce integrator gain are especially desirable in the FIG. 3 and FIG. 4 converters, since the second-order sigma-delta modulators show considerably greater tendency towards integrator overload than first-order sigma-delta modulators do. The second and third sigma-delta modulators of the FIG. 1 converter only have to accept quantization error input signals, which on average are smaller than the integrated error signals the second and third sigma-delta modulators of the FIG. 2 converter have to accept, so the FIG. 1 converter has less tendency towards problems arising from integrator overload than the FIG. 2 converter has. Similarly, the second sigma-delta modulator stage 30 of the FIG. 3 converter only has to accept a quantization error input signal, which on average is smaller than the integrated error signal the second sigma-delta modulator stage 30 of the FIG. 4 converter has to accept, so the FIG. 3 converter has less tendency towards problems arising from integrator overload than the FIG. 4 converter has.

Modifications to reduce integrator gain are represented in FIGS. 5–8 by scaling elements being inserted before the integrators. In actual practice, a scaling element for an analog quantity subsequently to be integrated can be provided by using a switched capacitor to pump charge, in an amount corresponding to that analog quantity, into a Miller integrator comprising an operational amplifier with a Miller feedback capacitor between its output and inverting input connections, the scaling factor being determined by the ratio of the capacitances of the switched and Miller feedback capacitors.

Figure 5:
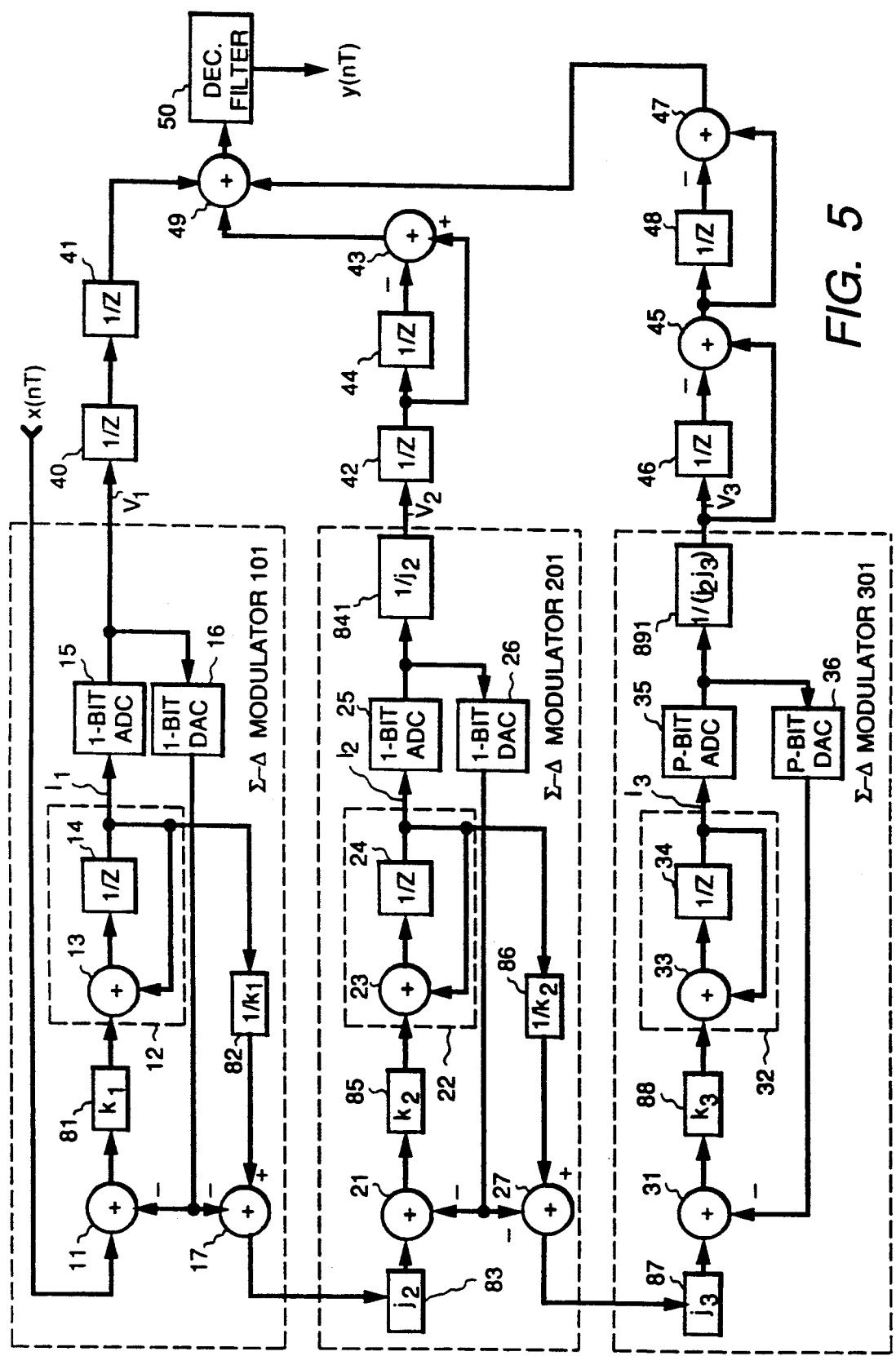
FIGS. 5, 6, 7 and 8 are schematic diagrams of practical modifications of the oversampling analog-to-digital converters of FIGS. 1, 2, 3 and 4, respectively.

FIG. 5 shows a modification of the oversampling converter prototype shown in FIG. 1. In the first sigma-delta modulator stage 101 of the FIG. 5 converter a scaling element 81 having a gain $k_1$ less than unity is inserted before the integrator 12 to reduce the likelihood of its output signal tending to exceed the range of available supply voltage. Since the quantizer 15 has only single-bit resolution, it determines only the polarity of the integrated error signal $I_1$, and the scaling down of $I_1$ has no effect on the digital output signal $V_1$ of quantizer 15. A scaling element 82 having a gain $1/k_1$ is inserted between the integrator 12 output port and the minuend input port of subtractor 17 to scale up the reduced integrated error signal $I_1$ so subtractor 17 difference output signal corresponds to the quantization noise of the first sigma-delta modulator stage 10 in FIG. 1 that differs from the first sigma-delta modulator stage 101 in FIG. 5 in not including scaling elements 81 and 82.

In the second sigma-delta modulator stage 201 the difference output signal from subtractor 17 is scaled by the factor $j_2$ by an analog scaling element 83. This scaling of the analog input signal to the second sigma-delta modulator stage 201 by the factor $j_2$ is compensated for by a digital scaling element 841 having a gain $1/j_2$ being inserted after ADC 25 to scale the digital output signal to its original value $V_2$. A scaling element 85 having a gain $k_2$ less than unity is inserted before the integrator 22 to reduce the likelihood of its output signal tending to exceed the range of available supply voltage. Since the quantizer 25 has only single-bit resolution, it determines only the polarity of the integrated error signal $I_2$, and the scaling down of $I_2$ by scaling element 85 has no effect on the digital output signal of quantizer 25 or on the digital output voltage $V_2$ scaled therefrom. A scaling element 86 having a gain $1/k_2$ is inserted between the integrator 22 output port and the minuend input port of subtractor 27 to scale up the reduced integrated error signal $I_2$ so subtractor 27 difference output signal corresponds to the quantization noise of the second sigma-delta modulator stage 20 in FIG. 1 that differs from the second sigma-delta modulator stage 201 in FIG. 5 in not including scaling elements 85 and 86.

In the third sigma-delta modulator stage 301 the difference output signal from subtractor 27 is scaled by the factor $j_3$ by an analog scaling element 87. FIG. 5 shows another analog scaling element 88 having a gain $k_3$ inserted before the integrator 32, and $k_3$ could be made less than unity to reduce the likelihood of its output signal tending to exceed the range of available supply voltage. However, the likelihood of the integrator 32 in the third sigma-delta modulator stage 301 overloading is substantially reduced by reason of ADC 35 and DAC 36 having plural-bit resolution, so the scaling element 88 can usually be safely made to have a gain $k_3$ of unity and the scaling element 87 can often be safely made to have a gain $j_3$ that is unity or somewhat larger. The digital output of an analog-to-digital converter with plural-bit resolution, such as ADC 35 is affected directly by the amplitude as well as the polarity of its analog input signal, so scaling down of its analog input signal alters the system functions for signal and for quantization noise, degrading resolution. The analog input signal to the third sigma-delta modulator stage 301 being scaled by the factor $j_2$, owing to the second sigma-delta modulator stage 201 being operated with its input signal being scaled by the factor $j_2$, and the scaling of the analog input signal to the third sigma-delta modulator stage 301 by the factor $j_3$ in scaling element 87 are both compensated for by a digital scaling element 891 having a gain $1/(j_2 j_3)$ being inserted after ADC 35 to scale the digital output signal to its original value $V_2$.

The scaling of digital samples in digital scaling elements 841 and 891 is by way of digital multiplication. Scaling up by an integral power of two is preferred, where possible, since then the digital multiplication may be simply accomplished using bit place shifting. The scaling of analog signals in scaling elements 81, 82, 83, 85, 86, 87 and 88 is normally accomplished by switched capacitor methods. The scaling of digital samples in the digital scaling element 891 in the FIG. 5 converter leads to a loss in resolution of $-\log_2 (j_2 j_3)$ bits, which by way of example is a two-bit loss when $j_2 = \frac{1}{2}$ and $j_3 = \frac{1}{2}$. Providing that the input voltage to the second sigma-delta modulator stage 201 is usually within the range bounded by DAC 26 minimum and maximum output voltages, scaling back using the $k_2$ factor, rather than using the $j_2$ factor, in the second sigma-delta modulator stage 201 results in less attendant loss in bit resolution. Scaling back using the $j_2$ factor is preferred when it is necessary to reduce the input voltage to the second sigma-delta modulator stage 201 so it is usually within the range bounded by DAC 26 minimum and maximum output voltages.

Figure 6:
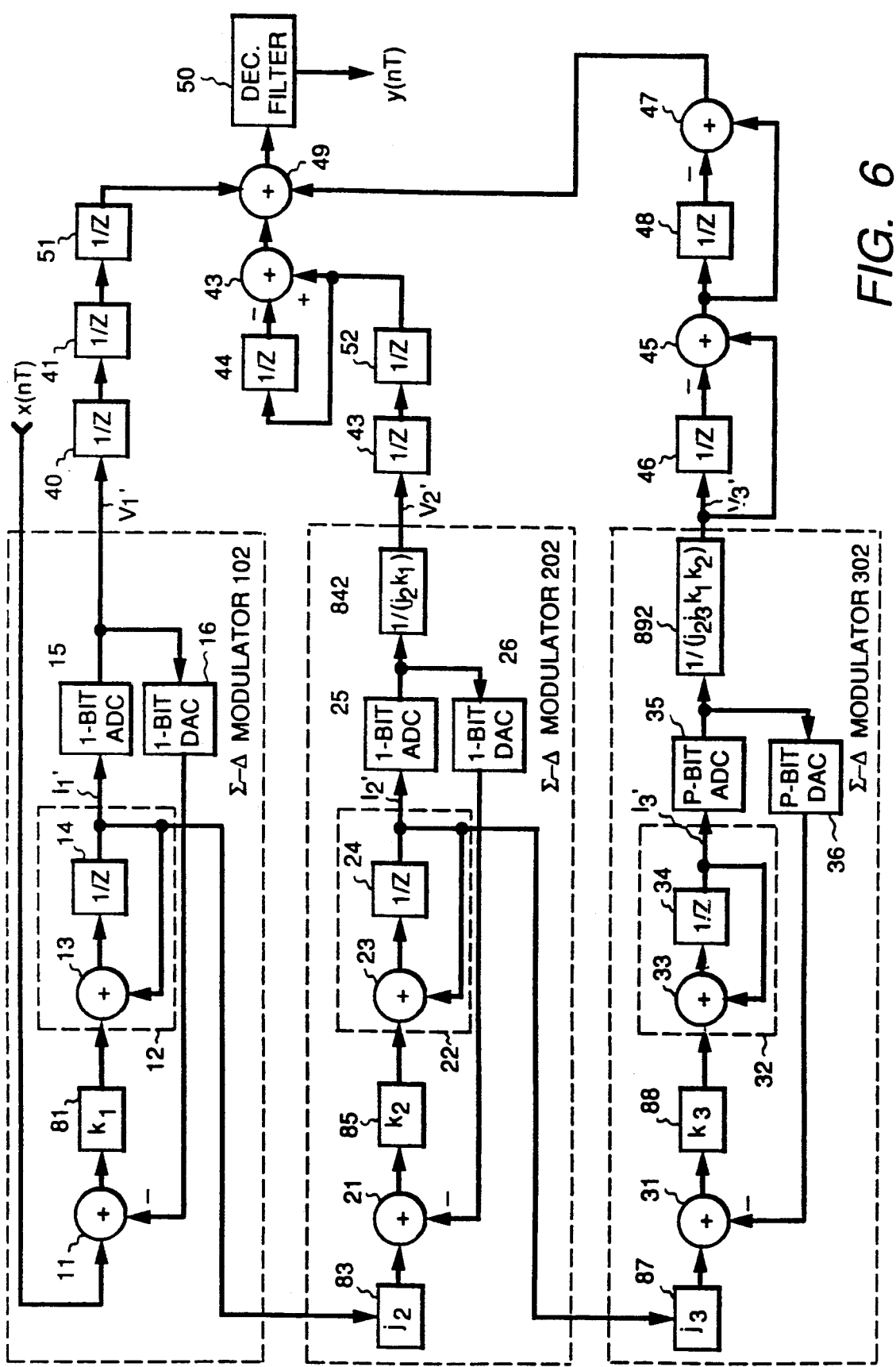

FIG. 6 shows a modification of the FIG. 2 oversampling converter analogous to the FIG. 5 modification of the FIG. 1 oversampling converter. However, in the FIG. 6 oversampling converter, analog scaling element 82 with gain $1/k_1$ is not included in a first sigma-delta modulator stage 102; and accordingly a second sigma-delta modulator stage 202 has a digital scaling element 842 to scale its digital output by a factor $1/(j_2k_1)$ instead of digital scaling element 841. Also, in the FIG. 6 oversampling converter, analog scaling element 86 is not included in the second sigma-delta modulator stage 202; and accordingly a third sigma-delta modulator stage 302 has a digital scaling element 892 to scale its digital output by a factor $1/(j_2j_3k_1k_2)$ instead of digital scaling element 891. The scaling of digital samples in the digital scaling element 892 in the FIG. 6 converter leads to a loss in resolution of $-\log_2(j_2j_3k_1k_2)$ bits, which by way of example is a three-bit loss when $j_2$ and $j_3$ each equal square root of two, $k_1 = \frac{1}{2}$ and $k_2 = \frac{1}{2}$.

Figure 7:
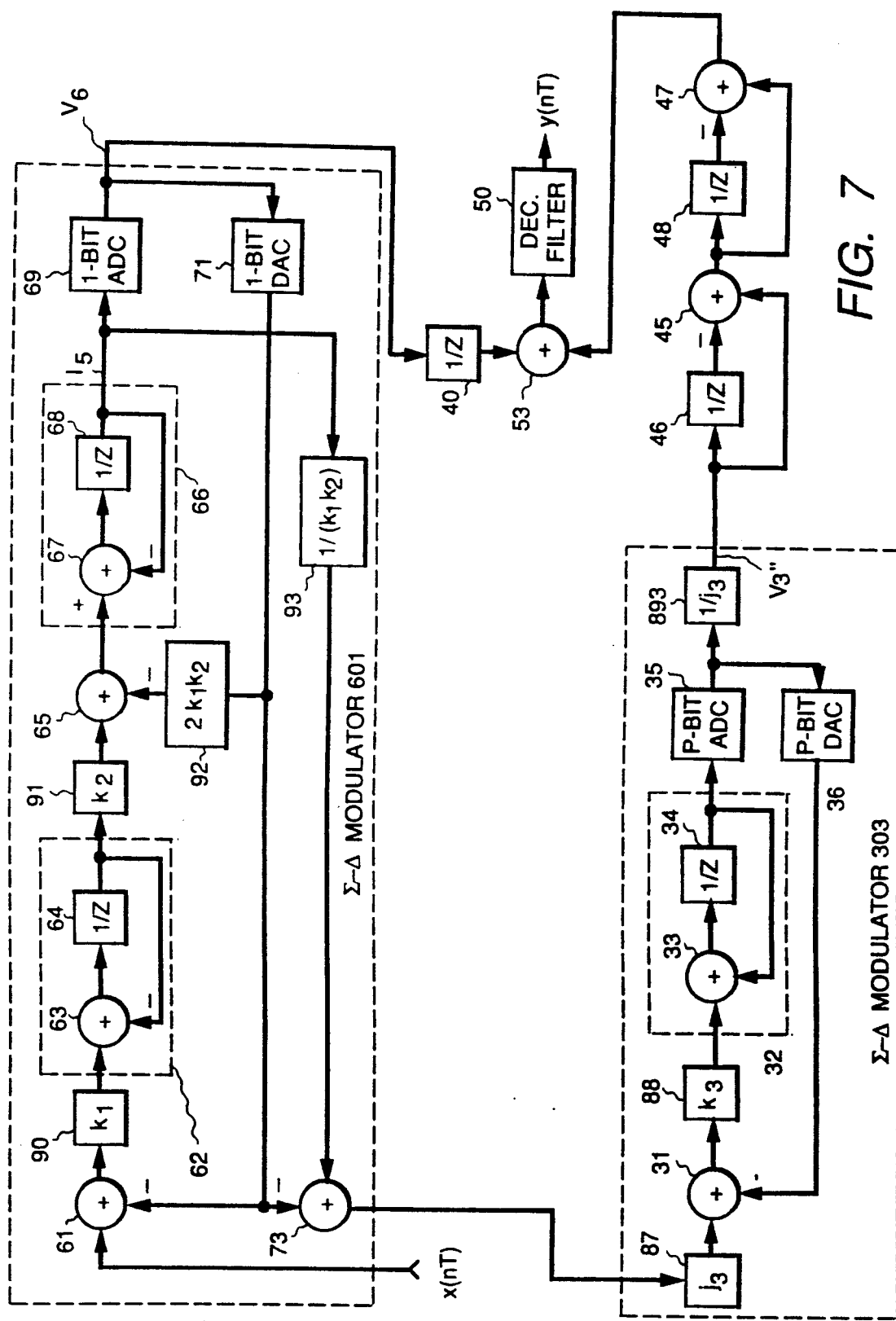

FIG. 7 shows a modification of the oversampling converter prototype shown in FIG. 3. In a second-order sigma-delta modulator stage 601 that is the initial sigma-delta modulator stage in the FIG. 7 converter a scaling element 90 having a gain $k_1$ less than unity is inserted before the integrator 62 to reduce the likelihood of its output signal tending to exceed the range of available supply voltage, and a scaling element 91 having a gain $k_2$ less than unity is inserted before the minuend input port of the subtractor 65 to reduce the likelihood of the integrator 66 output signal tending to exceed the range of available supply voltage. Since the quantizer 69 has only single-bit resolution, it determines only the polarity of the integrated error signal $I_5$, and the scaling down of $I_4$ and the subsequent scaling down of $I_5$ have no effect on the digital output signal $V_6$ of quantizer 69. The scaling element 72 scaling up by a factor 2 in FIG. 3 is replaced in FIG. 7 by a scaling element 92 having a gain $2k_1k_2$ and so scaling the subtrahend input signal to subtractor 65 by an additional factor of $k_1k_2$ compared to FIG. 3 to match the $k_1k_2$ factor by which its minuend input signal is scaled by scaling elements 90 and 91. A scaling element 93 having a gain $1/(k_1k_2)$ scales up $I_5$ to its original FIG. 3 value for application to the minuend input port of subtractor 73.

The FIG. 7 converter has a final sigma-delta modulator stage 303 which differs from the final sigma-delta modulators of the FIG. 5 and FIG. 6 converters in that a digital scaling element 893 having a gain $1/j_3$ replaces the digital scaling elements 891 and 892. An analog scaling element 87 having a gain $j_3$ is inserted in the input connection of sigma-delta modulator stage 302, and an analog scaling element 88 having a gain $k_3$ is inserted before its integrator 32. The scaling of the input signal to sigma-delta modulator stage 303 by the factor $j_3$ in scaling element 87 is compensated for, where $j_3$ is other than unity, by the digital scaling element 893 having a gain $1/j_3$ being inserted after ADC 35 to scale the digital output signal at the sigma-delta modulator stage 301 output port to be its previous value $V_3$. The scaling of digital samples in the digital scaling element 893 in the FIG. 7 converter leads to a loss in resolution only of $-\log_2 j_3$ bits.

Figure 8:
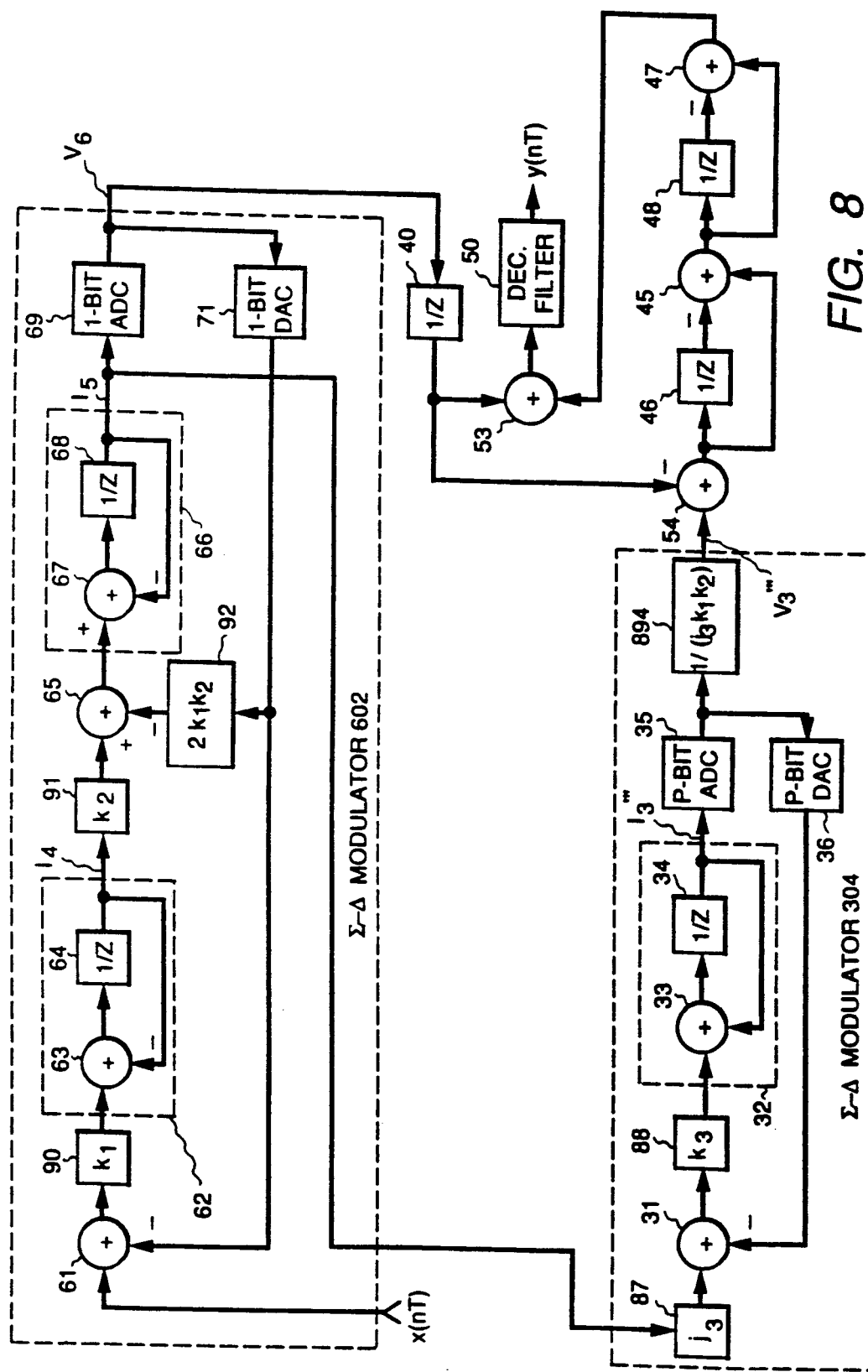

FIG. 8 shows a modification of the FIG. 4 oversampling converter analogous to the FIG. 7 modification of the FIG. 3 oversampling converter. An initial, second-order sigma-delta modulator stage 602 of the FIG. 8 oversampling converter does not include the further scaling element 93 to scale by a factor $k_1k_2$ the input signal to a final, first-order sigma-delta modulator stage 304 of the FIG. 8 oversampling converter. Accordingly, a digital scaling element 894 scales the output signal of the sigma-delta modulator stage 304 by the factor $1/(j_3k_1k_2)$. The scaling up of digital samples in the digital scaling element 894 leads to a loss in resolution of $-\log_2(j_3k_1k_2)$, which by way of example is a two-bit loss when $j_3 = 1$, $k_1 = \frac{1}{2}$ and $k_2 = \frac{1}{2}$.

The sensitivity of the converters of FIGS. 1–8 to nonlinearity of DAC 35 at baseband frequencies, particularly the lower ones, is substantially reduced by the double differentiation of the final sigma-delta modulator stage digital output signal. So, while increasing DAC 35 bit resolution similarly increases the bit resolution of any one of the complete analog-to-digital converters, the possible nonlinearity in DAC 35 conversion is diluted in the baseband digital output signal of the converter. Accordingly, the linearity in DAC 35 need only be maintained consistent with its contribution to the overall response of the complete analog-to-digital converter at baseband frequencies, in order not to substantially reduce the linearity of that overall response, rather than needing to be maintained consistent with the bit resolution of the complete analog-to-digital converter at baseband frequencies. The digital scaling element 891, 892, 893 or 894 does not introduce any nonlinear error.

Figure 9:
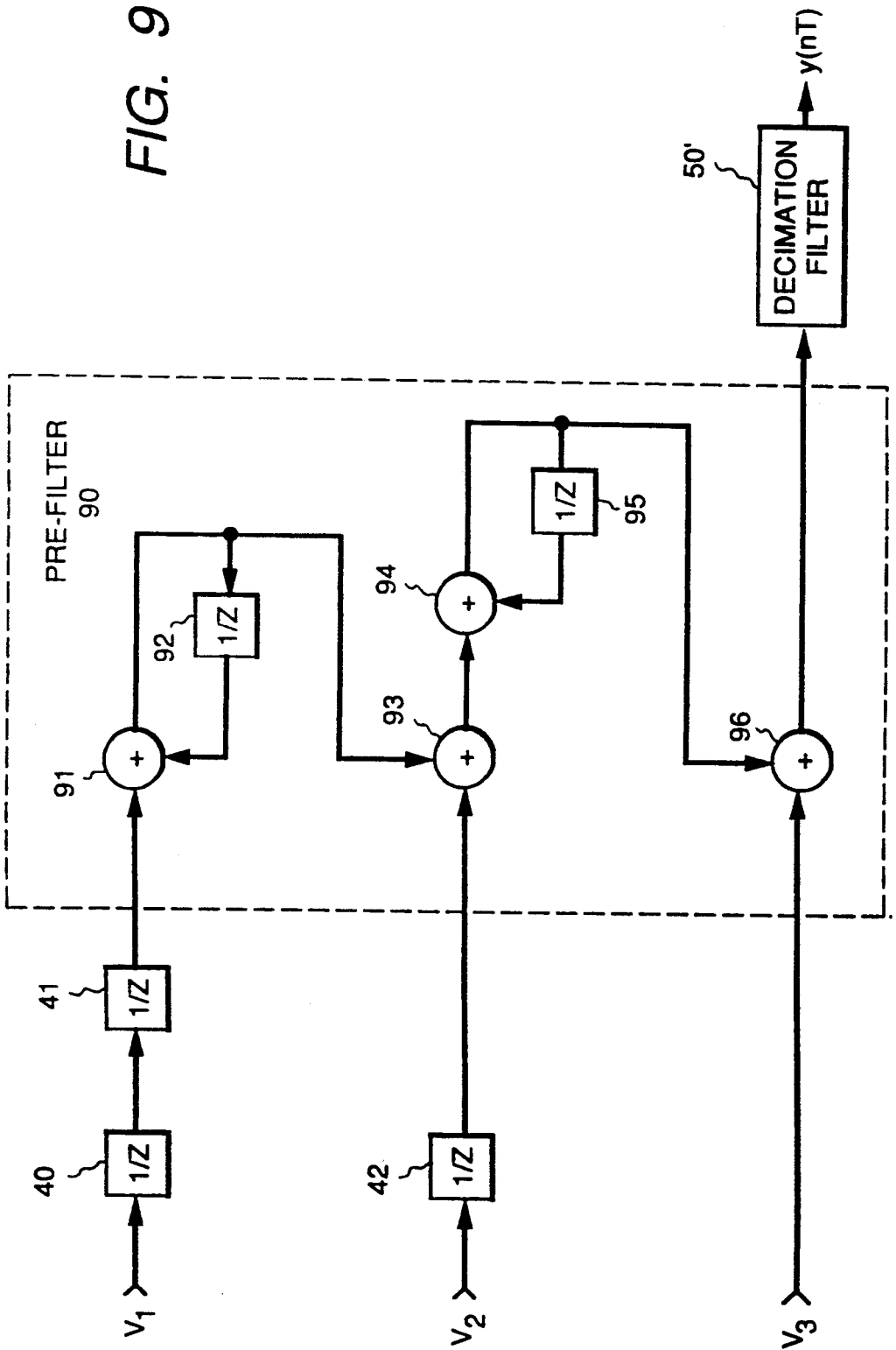
FIG. 9 is a schematic diagram of a modification that is made to either the FIG. 1 or FIG. 5 oversampling analog-to-digital converter in other embodiments of the invention.

FIG. 9 is a schematic diagram of a possible modification to either the FIG. 1 or FIG. 5 oversampling analog-to-digital converter. The combining of $V_1$, $V_2$ and $V_3$ is done in a pre-filter 90 before the decimation filter 50. Rather than differentiating $V_2$ and twice differentiating $V_3$ as done in the FIG. 1 or FIG. 5 converter as originally shown, in the FIG. 9 modification $V_1$ is once integrated before being combined with $V_2$, and the sum of $V_1$ and $V_2$ is once integrated before being combined with $V_3$. The integration of $V_1$, which is a low-pass filtering step, is done using a digital adder 91 to add its output as delayed by a one-sample digital delay element 92. A digital adder 93 adds the two-sample-delayed and once-integrated $V_1$ to the one-sample-delayed $V_2$. In another low-pass filtering step, the sum from digital adder 93 is integrated using a digital adder 94 to add its output as delayed by a one-sample digital delay element 95. A digital adder 96 sums $V_3$ with the integrated sum from digital adder 93 to provide an input signal to the decimation filter 50', which responds with y(nT). Pre-filter 90 is a low-pass filter that has an infinite impulse response, and one may view pre-filter 90 and decimation filter 50' as being components of a more complex decimation filter than 50'.

Figure 10:
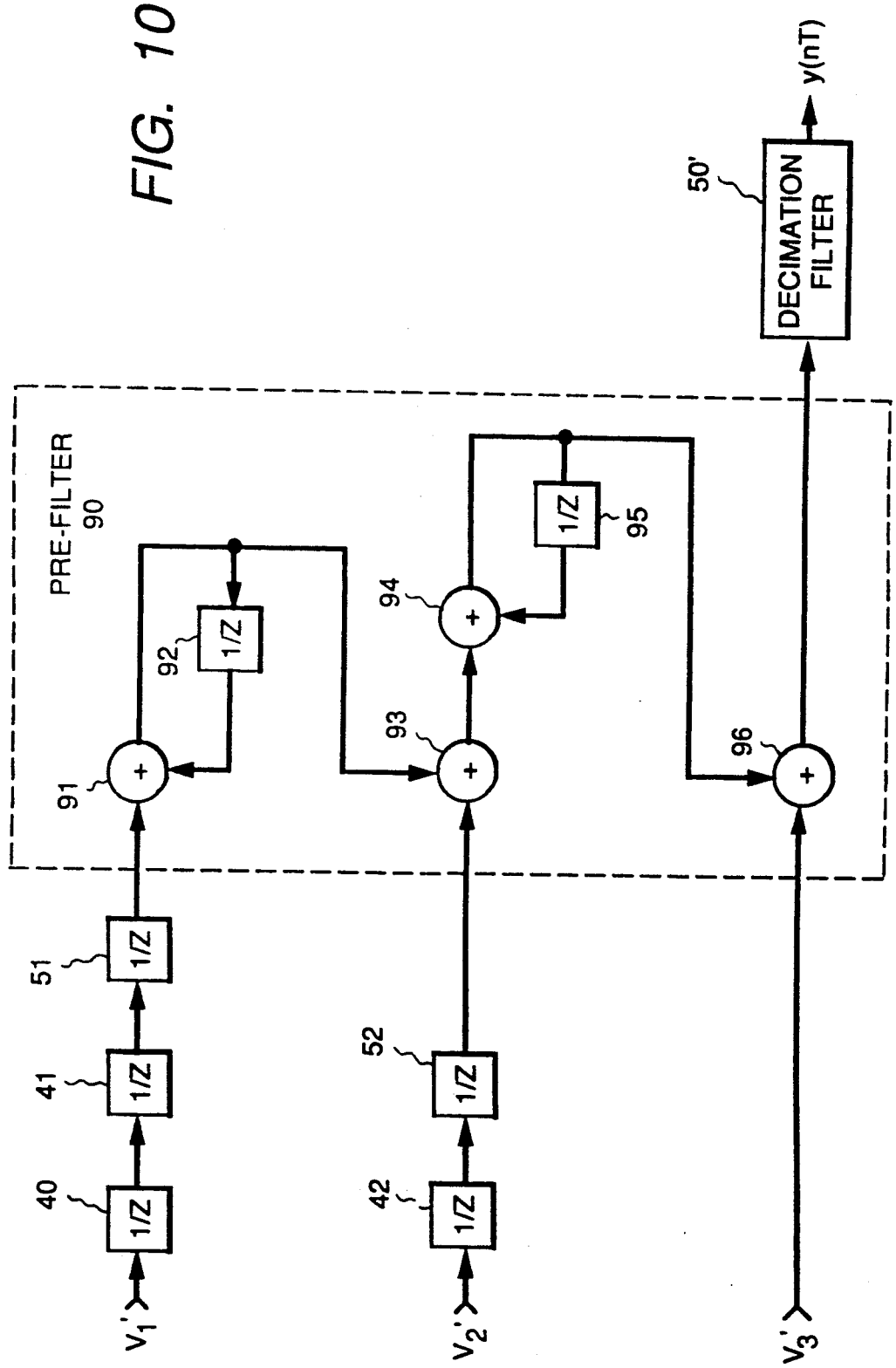
FIG. 10 is a schematic diagram of a modification that is made to either the FIG. 2 or FIG. 6 oversampling analog-to-digital converter in other embodiments of the invention.

FIG. 10 shows a possible modification that can be made to either the FIG. 2 or FIG. 6 oversampling analog-to-digital converter, wherein $V_1$ as delayed by two sample times, $V_2'$ as delayed by one sample time and $V_3'$ are combined within the pre-filter 90.

Figure 11:
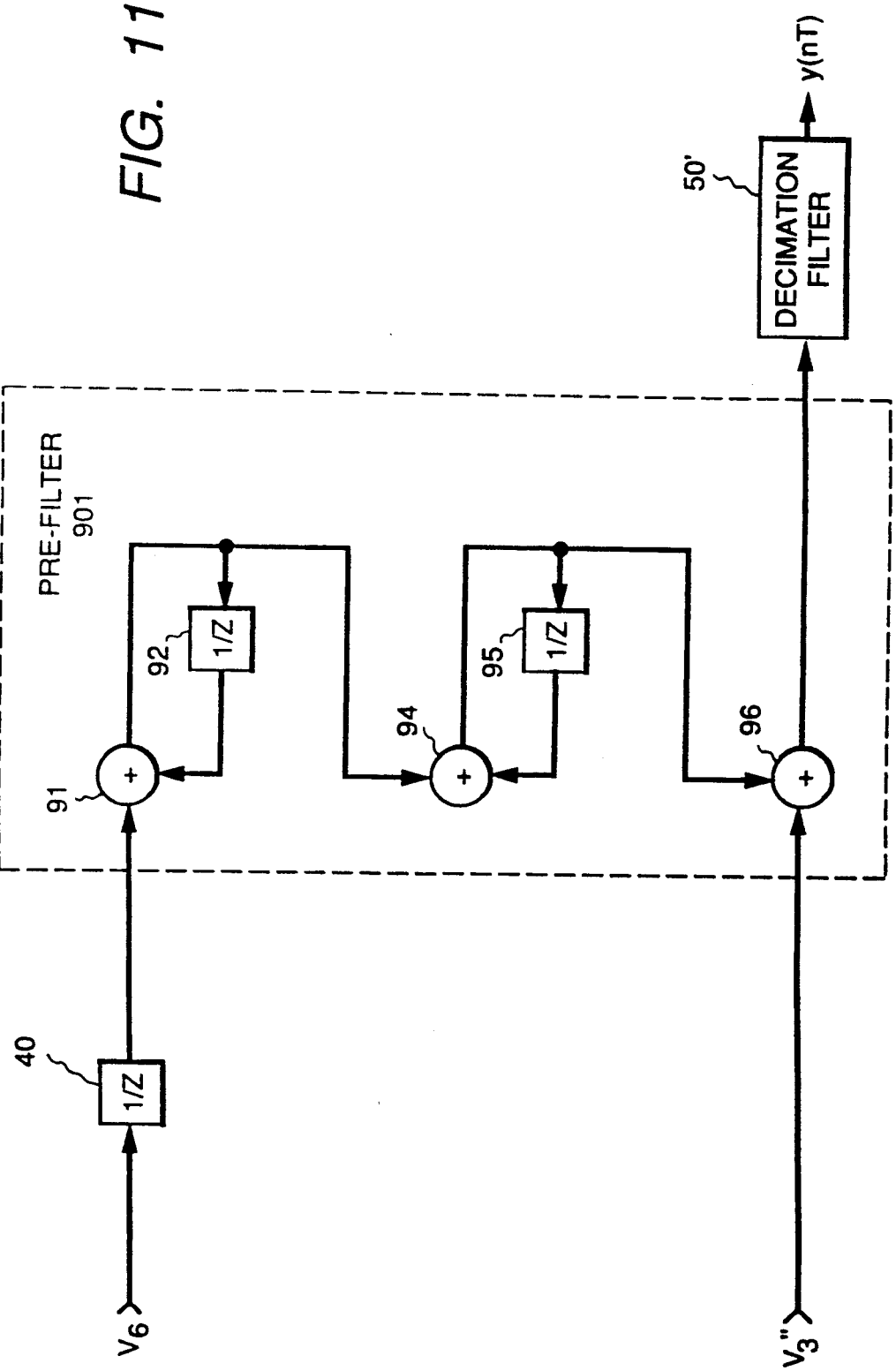
FIG. 11 is a schematic diagram of a modification that is made to either the FIG. 3 or FIG. 7 oversampling analog-to-digital converter in other embodiments of the invention.

FIG. 11 shows a possible modification that can be made to either the FIG. 3 or FIG. 7 oversampling analog-to-digital converter, wherein $V_6$ as delayed by one sample time and $V_3''$ are combined within a pre-filter 901. Pre-filter 901 is similar to the pre-filter 90 except for not using the digital adder 93.

Figure 12:
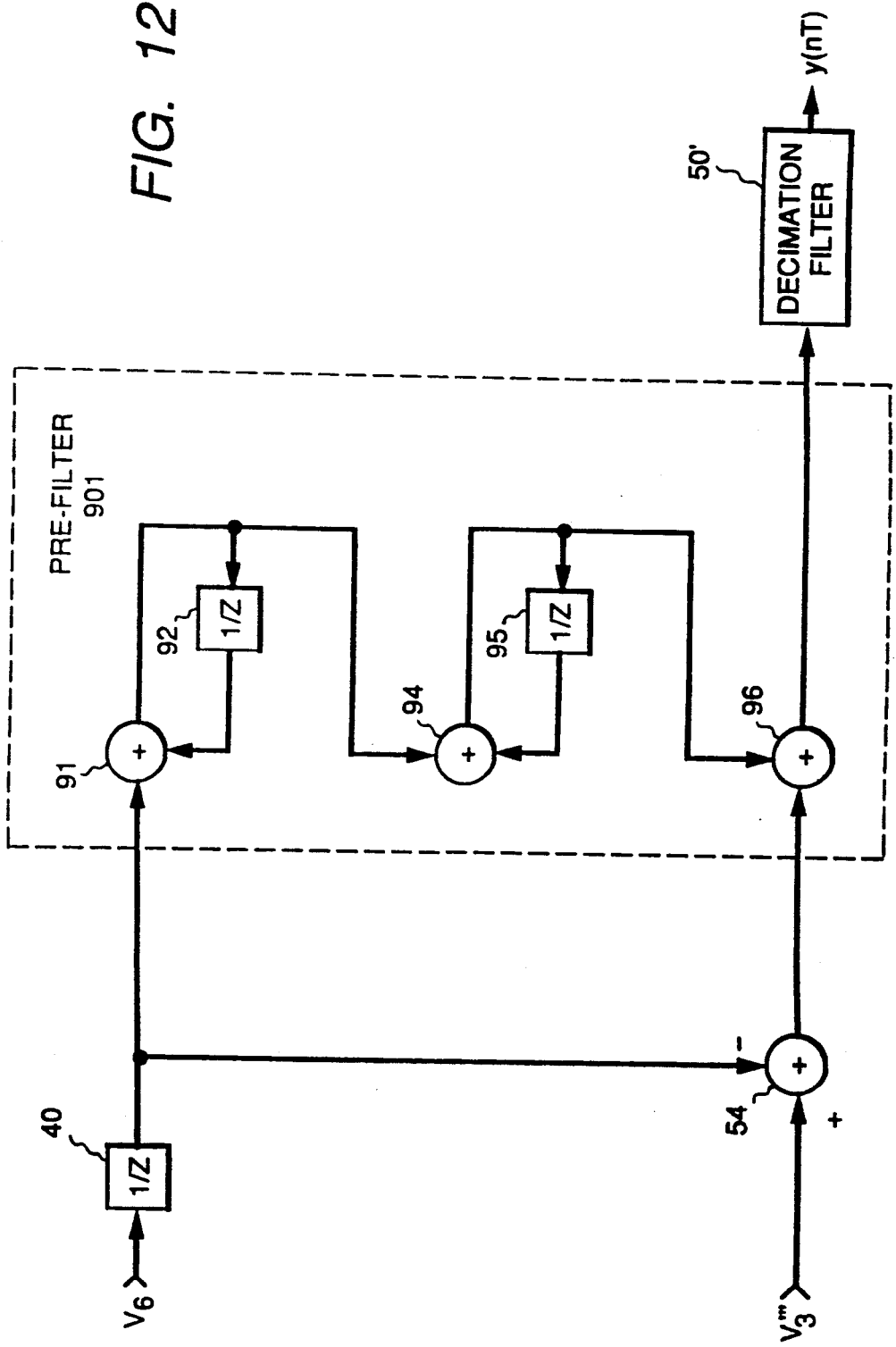
FIG. 12 is a schematic diagram of a modification that is made to either the FIG. 4 or FIG. 8 oversampling analog-to-digital converter in other embodiments of the invention.

FIG. 12 shows a possible modification that can be made to either the FIG. 4 or FIG. 8 oversampling analog-to-digital converter, wherein $V_6$ is combined within the pre-filter 901 with ($V_3'''-V_6$) from digital subtractor 54.

Figure 13:
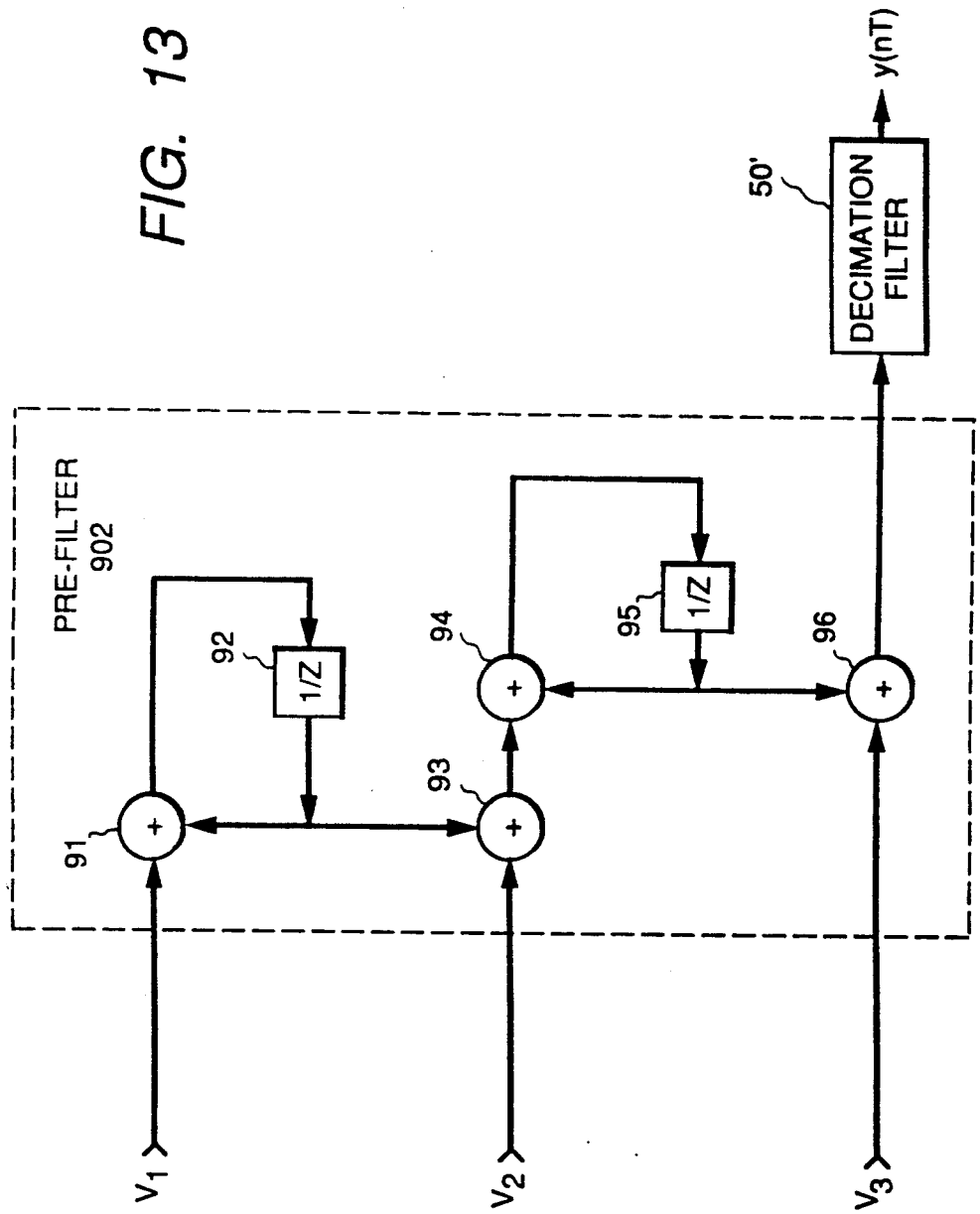
FIG. 13 is a schematic diagram of a variant of the FIG. 10 modification.

FIG. 13 shows a variant of the FIG. 9 modification wherein a pre-filter 902 replaces pre-filter 901 and direct connections replace one-sample delay elements 40-42. In pre-filter 902 the output signal is taken from the integrator comprising the digital adder 94 and one-sample delay element 95 at a point after delay element 95, rather than before, eliminating the need for delay element 42 and one of the delay elements 40 and 41. The input signal for digital adder 93 is taken from the integrator comprising the digital adder 91 and one-sample delay element 92 at a point after delay element 92, rather than before, eliminating the need for the other of the delay elements 40 and 41. A variant of the FIG. 10 modification using pre-filter 902 in place of pre-filter 90 allows for direct connections to replace the one-sample delay elements 40-42 therein. One of the integrators in pre-filter 901 of FIG. 11 may be reconnected to provide the one-sample delay of $V_6$, so a direct connection can replace delay element 40. The delay elements 40-42 are each only a single-bit wide, so their elimination is not a great savings in hardware.

Modifications of any of the converters shown in FIGS. 1, 2, 5 and 6 are also possible wherein the first sigma-delta modulator stage output voltage $V_1$ is once integrated, the second sigma-delta modulator stage output voltage $V_2$ (or $V_2'$) is neither integrated or differentiated, and the third sigma delta modulator stage output voltage $V_3$ (or $V_3'$) is once differentiated, prior to these voltages being combined to suppress quantization noise arising in the earlier sigma-delta modulator stages.

The converters thusfar described can be modified, to generate further embodiments of the invention, by performing digital scaling procedures within digital circuitry following the sigma-delta modulators, rather than within the sigma-delta modulators. The locations of analog scaling elements in the electrical network forming any one of the oversampling converters can be modified by substituting known electrical equivalents for portions of the network. Such modifications are all incidental to the invention.

One skilled in the art and acquainted with the foregoing disclosure will be enabled to design a number of different embodiments of the invention and, accordingly, the following claims should be interpreted with as broad scope as possible.

What is claimed is:

1. An improved oversampling converter of a type using a plural-order sigma-delta modulator; said plural-order sigma-delta modulator having a plurality of sigma-delta modulator stages for providing respective digital output signals responsive to respective analog input signals as respectively reduced by respective analog feedback signals; said improved oversampling converter also of a type including means for combining the digital output signals of said plurality of sigma-delta modulator stages to suppress in a resulting combined signal the quantization noise arising in at least one of said sigma-delta modulator stages, each said sigma-delta modulator stage that has its quantization noise suppressed in said resulting combined signal being referred to hereinafter as a selected one of said sigma-delta modulator stages; said improved oversampling converter also of a type having a decimation filter connected for responding to said resulting combined signal to generate an analog-to-digital conversion result; wherein the improvement comprises: a respective analog-to-digital converter and a respective digital-to-analog converter each having plural-bit resolution included in each of said sigma-delta modulator stages that is other than a said selected one of said sigma-delta modulator stages, and a respective analog-to-digital converter and a respective digital-to-analog converter each having single-bit resolution included in each selected one of said sigma-delta modulator stages, the respective analog-to-digital converter in each of said sigma-delta modulator stages generating the respective digital output signal of that stage which is converted to its respective analog feedback signal by the respective digital-to-analog converter of that stage.

2. An improved oversampling converter as set forth in claim 1 including:
   a first sigma-delta modulator stage including within a first feedback loop a first integrator followed by a first analog-to-digital converter followed by a first digital-to-analog converter, said first analog-to-digital and first digital-to-analog converters having single-bit resolution;
   a second sigma-delta modulator stage including within a second feedback loop a second integrator followed by a second analog-to-digital converter followed by a second digital-to-analog converter, said second analog-to-digital and second digital-to-analog converters having single-bit resolution;
   a third sigma-delta modulator stage including within a third feedback loop a third integrator followed by a third analog-to-digital converter followed by a third digital-to-analog converter, said third analog-to-digital and third digital-to-analog converters having plural-bit resolution;
   means for applying an analog signal to be digitized by said improved oversampling converter as the analog input signal of said first sigma-delta modulator stage;
   means for determining the quantization noise of said first sigma-delta modulator stage;
   means for applying the quantization noise of said first sigma-delta modulator stage to said second sigma-delta modulator stage as the analog input signal thereof;
   means for determining the quantization noise of said second sigma-delta modulator stage; and
   means for applying the quantization noise of said second sigma-delta modulator stage to said third sigma-delta modulator stage as the analog input signal thereof.

3. An improved oversampling converter as set forth in claim 2 including within said means for combining the digital output signals of said plurality of sigma-delta modulator stages:
   means for twice differentiating the digital output signal of said third sigma-delta modulator stage with respect to time, thereby to obtain a twice-differentiated third sigma-delta modulator stage digital output signal;
   means for once differentiating the digital output signal of said second sigma-delta modulator stage with respect to time, thereby to obtain a once-differentiated second sigma-delta modulator stage digital output signal;

means for combining said first sigma-delta modulator stage digital output signal, said once-differentiated second sigma-delta modulator stage digital output signal and said twice-differentiated third sigma-delta modulator stage digital output signal, thereby to generate said resulting combined signal; and means for providing compensating delays to the digital output signal of said first sigma-delta modulator stage and to said once-differentiated second sigma-delta modulator stage digital output signal as results in the combining thereof with said twice-differentiated third sigma-delta modulator stage digital output signal suppressing in said resulting combined signal the quantization noise arising from said first sigma-delta modulator stage and also the quantization noise arising from said second sigma-delta modulator stage.

4. An improved oversampling converter as set forth in claim 2 including within said means for combining the digital output signals of said plurality of sigma-delta modulator stages:

means for twice integrating the digital output signal of said first sigma-delta modulator stage with respect to time, thereby to obtain a twice-integrated first sigma-delta modulator stage digital output signal;

means for once integrating the digital output signal of said second sigma-delta modulator stage with respect to time, thereby to obtain a once-integrated second sigma-delta modulator stage digital output signal;

means for combining said twice-integrated sigma-delta modulator stage digital output signal, said once-integrated second sigma-delta modulator stage digital output signal and said third sigma-delta modulator stage digital output signal, thereby to generate said resulting combined signal; and means for providing compensating delays to said twice-integrated first sigma-delta modulator stage digital output signal and to said once-integrated second sigma-delta modulator stage digital output signal such that the combining thereof with said third sigma-delta modulator stage digital output signal suppresses in said resulting combined signal the quantization noise arising from said first sigma-delta modulator stage and also the quantization noise arising from said second sigma-delta modulator stage.

5. An improved oversampling converter as set forth in claim 1 including:

a first sigma-delta modulator stage including within a first feedback loop a first integrator followed by a first analog-to-digital converter followed by a first digital-to-analog converter, said first analog-to-digital and first digital-to-analog converters having single-bit resolution;

a second sigma-delta modulator stage including within a second feedback loop a second integrator followed by a second analog-to-digital converter followed by a second digital-to-analog converter, said second analog-to-digital and second digital-to-analog converters having single-bit resolution;

a third sigma-delta modulator stage including within a third feedback loop a third integrator followed by a third analog-to-digital converter followed by a third digital-to-analog converter, said third analog-to-digital and third digital-to-analog converters having plural-bit resolution;

means for applying an analog signal to be digitized by said improved oversampling converter as the analog input signal of said first sigma-delta modulator stage;

means for supplying the analog input signal of said second sigma-delta modulator stage from said first integrator within said first sigma-delta modulator stage; and means for supplying the analog input signal of said third sigma-delta modulator stage from said second integrator within said second sigma-delta modulator stage.

6. An improved oversampling converter as set forth in claim 5 including within said means for combining the digital output signals of said plurality of sigma-delta modulator stages:

means for twice differentiating the digital output signal of said third sigma-delta modulator stage with respect to time, thereby to obtain a twice-differentiated third sigma-delta modulator stage digital output signal;

means for once differentiating the digital output signal of said second sigma-delta modulator stage with respect to time, thereby to obtain a once-differentiated second sigma-delta modulator stage digital output signal;

means for combining the digital output signal of said first sigma-delta modulator stage, said once-differentiated second sigma-delta modulator stage digital output signal and said twice-differentiated third sigma-delta modulator stage digital output signal, thereby to generate said resulting combined signal; and means for providing compensating delays to said first sigma-delta modulator stage digital output signal and to said once-differentiated second sigma-delta modulator stage digital output signal such that the combining thereof with said twice-differentiated third sigma-delta modulator stage digital output signal suppresses in said resulting combined signal the quantization noise arising from said first sigma-delta modulator stage and the quantization noise arising from said second sigma-delta modulator stage.

7. An improved oversampling converter as set forth in claim 5 including within said means for combining the digital output signals of said plurality of sigma-delta modulator stages:

means for twice integrating the digital output signal of said first sigma-delta modulator stage with respect to time, thereby to obtain a twice-integrated first sigma-delta modulator stage digital output signal;

means for once integrating the digital output signal of said second sigma-delta modulator stage with respect to time, thereby to obtain a once-integrated second sigma-delta modulator stage digital output signal;

means for combining said twice-integrated sigma-delta modulator stage digital output signal, said once-integrated second sigma-delta modulator stage digital output signal and said third sigma-delta modulator stage digital output signal, thereby to generate said resulting combined signal; and means for providing compensating delays to said twice-integrated first sigma-delta modulator stage digital output signal and to said once-integrated second sigma-delta modulator stage digital output signal such that the combining thereof with said third sigma-delta modulator stage digital output signal suppresses in said resulting combined signal the quantization noise arising from said first sigma-delta modulator stage and also the quantization noise arising from said second sigma-delta modulator stage.

8. An improved oversampling converter as set forth in claim 1 including:

a first sigma-delta modulator stage including first and second feedback loops, including a first integrator within said first feedback loop, including within both said first and said second feedback loops a second integrator followed by a first analog-to-digital converter followed by a first digital-to-analog converter, said first analog-to-digital and first digital-to-analog converters having single-bit resolution;

a second sigma-delta modulator stage including within a third feedback loop a third integrator followed by a second analog-to-digital converter followed by a second digital-to-analog converter, said second analog-to-digital and second digital-to-analog converters having plural-bit resolution;

means for applying an analog signal to be digitized by said improved oversampling converter as the analog input signal of said first sigma-delta modulator stage;

means for determining the quantization noise of said first sigma-delta modulator stage; and means for applying the quantization noise of said first sigma-delta modulator stage to said second sigma-delta modulator stage as the analog input signal thereof.

9. An improved oversampling converter as set forth in claim 8 including within said means for combining the digital output signals of said plurality of sigma-delta modulator stages:

means for twice differentiating the digital output signal of said second sigma-delta modulator stage with respect to time, thereby to obtain a twice-differentiated second sigma-delta modulator stage digital output signal;

means for combining the digital output signal of said first sigma-delta modulator stage and said twice-differentiated second sigma-delta modulator stage digital output signal, thereby to generate said resulting combined signal; and means for providing compensating delay to said first sigma-delta modulator stage digital output signal so that the combining thereof with said twice-differentiated second sigma-delta modulator stage digital output signal suppresses in said resulting combined signal the quantization noise arising from said first sigma-delta modulator stage.

10. An improved oversampling converter as set forth in claim 8 including within said means for combining the digital output signals of said plurality of sigma-delta modulator stages:

means for twice integrating the digital output signal of said first sigma-delta modulator stage with respect to time, thereby to obtain a twice-integrated first sigma-delta modulator stage digital output signal;

means for combining said twice-integrated first sigma-delta modulator stage digital output signal and said second sigma-delta modulator stage digital output signal, thereby to generate said resulting combined signal; and means for providing compensating delay to said twice-integrated first sigma-delta modulator stage digital output signal such that the combining thereof with said second sigma-delta modulator stage digital output signal suppresses in said resulting combined signal the quantization noise arising from said first sigma-delta modulator stage.

11. An improved oversampling converter as set forth in claim 1 including:

a first sigma-delta modulator stage including first and second feedback loops, including a first integrator within said first feedback loop, including within both said first and said second feedback loops a second integrator followed by a first analog-to-digital converter followed by a first digital-to-analog converter, said first analog-to-digital and first digital-to-analog converters having single-bit resolution;

a second sigma-delta modulator stage including within a third feedback loop a third integrator followed by a second analog-to-digital converter followed by a second digital-to-analog converter, said second analog-to-digital and second digital-to-analog converters having plural-bit resolution;

means for applying an analog signal to be digitized by said improved oversampling converter as the analog input signal of said first sigma-delta modulator stage;

means for supplying the analog input signal of said second sigma-delta modulator stage from said second integrator within said first sigma-delta modulator stage; and, within said means for combining the digital output signals of said plurality of sigma-delta modulator stages, means for initially combining the digital output signals of said first and second sigma-delta modulator stages to generate a digital result therefrom; and means for providing compensating delay to the digital output signal of said first sigma-delta modulator stage so that the initial combining thereof with the digital output signal of said second sigma-delta modulator stage suppresses, in said digital result from said means for initially combining, terms arising from the analog signal to be digitized by said improved oversampling converter.

12. An improved oversampling converter as set forth in claim 11 also including within said means for combining the digital output signals of said plurality of sigma-delta modulator stages:

means for twice differentiating with respect to time the digital result from said means for initially combining the digital output signals of said first and second sigma-delta modulator stages, thereby to generate a twice-differentiated digital result; and means for combining said twice-differentiated digital result together with the digital output signal of said first sigma-delta modulator stage as provided with said compensating delay, thereby to generate said resulting combined signal in which the quantization noise from said first sigma-delta modulator stage is suppressed.

13. An improved oversampling converter as set forth in claim 11 also including within said means for combining the digital output signals of said plurality of sigma-delta modulator stages:

means for twice integrating with respect to time the digital output signal of said first sigma-delta modulator stage as provided said compensating delay, thereby to obtain a twice-integrated delayed first sigma-delta modulator stage digital output signal;

means for combining said twice-integrated delayed first sigma-delta modulator stage digital output signal with digital result from said means for initially combining the digital output signals of said first and second sigma-delta modulator stages, thereby to generate said resulting combined signal in which the quantization noise from said first sigma-delta modulator stage is suppressed.

14. An improved oversampling converter of a type using a plural-order sigma-delta modulator; said plural-order sigma-delta modulator having a plurality of successive sigma-delta modulator stages for providing respective digital output signals responsive to their respective analog input signals as respectively reduced by respective analog feedback signals; said improved oversampling converter also of a type including means for combining the digital output signals of said plurality of sigma-delta modulator stages to suppress in a resulting combined signal the quantization noise arising in at least one selected one of said sigma-delta modulator stages other than a final of said plurality of sigma-delta modulator stages; said improved oversampling converter also of a type having a decimation filter connected for responding to said resulting combined signal to generate an analog-to-digital conversion result; wherein the improvement comprises: the final sigma-delta modulator stage including an analog-to-digital converter and a digital-to-analog converter each having plural-bit resolution, which resolution is higher than the resolution of analog-to-digital and digital-to-analog converters included within each other of said sigma-delta modulator stages, the respective analog-to-digital converter in each of said sigma-delta stages generating the respective digital output signal of that stage which is converted to its respective analog feedback signal by the respective digital-to-analog converter of that stage.

15. An improved oversampling converter as set forth in claim 14 wherein the resolution of analog-to-digital and digital-to-analog converters included within each other of said feedback loops is single-bit resolution.

16. An improved oversampling converter as set forth in claim 15 including:
a first sigma-delta modulator stage including within a first feedback loop a first integrator followed by a first analog-to-digital converter followed by a first digital-to-analog converter, said first analog-to-digital and first digital-to-analog converters having single-bit resolution;
a second sigma-delta modulator stage including within a second feedback loop a second integrator followed by a second analog-to-digital converter followed by a second digital-to-analog converter, said second analog-to-digital and second digital-to-analog converters having single-bit resolution;
a third sigma-delta modulator stage including within a third feedback loop a third integrator followed by a third analog-to-digital converter followed by a third digital-to-analog converter, said third analog-to-digital and third digital-to-analog converters having plural-bit resolution;
means for applying an analog signal to be digitized by said improved oversampling converter as the analog input signal of said first sigma-delta modulator stage;
means for determining the quantization noise of said first sigma-delta modulator stage;
means for applying the quantization noise of said first sigma-delta modulator stage to said second sigma-delta modulator stage as the analog input signal thereof;
means for determining the quantization noise of said second sigma-delta modulator stage; and
means for applying the quantization noise of said second sigma-delta modulator stage to said third sigma-delta modulator stage as the analog input signal thereof.

17. An improved oversampling converter as set forth in claim 16 including within said means for combining the digital output signals of said plurality of sigma-delta modulator stages:
means for twice differentiating the digital output signal of said third sigma-delta modulator stage with respect to time, thereby to obtain a twice-differentiated third sigma-delta modulator stage digital output signal;
means for once differentiating the digital output signal of said second sigma-delta modulator stage with respect to time, thereby to obtain a once-differentiated second sigma-delta modulator stage digital output signal;
means for combining the digital output signal of said first sigma-delta modulator stage, said once-differentiated second sigma-delta modulator stage digital output signal and said twice-differentiated third sigma-delta modulator stage digital output signal, thereby to generate said resulting combined signal;
means for applying said resulting combined signal as an input signal to said decimation filter; and
means for providing compensating delays to the digital output signal of said first sigma-delta modulator stage and to said once-differentiated second sigma-delta modulator stage digital output signal so that the combining thereof with said twice-differentiated third sigma-delta modulator stage digital output signal suppresses in said resulting combined signal the quantization noise arising from said first sigma-delta modulator stage and also the quantization noise arising from said second sigma-delta modulator stage.

18. An improved oversampling converter as set forth in claim 16 including within said means for combining the digital output signals of said plurality of sigma-delta modulator stages:
means for twice integrating the digital output signal of said first sigma-delta modulator stage with respect to time, thereby to obtain a twice-integrated first sigma-delta modulator stage digital output signal;
means for once integrating the digital output signal of said second sigma-delta modulator stage with respect to time, thereby to obtain a once-integrated second sigma-delta modulator stage digital output signal;
means for combining said twice-integrated first sigma-delta modulator stage digital output signal, said once-integrated second sigma-delta modulator stage digital output signal and the digital output signal of said third sigma-delta modulator stage, thereby to generate said resulting combined signal;

means for applying said resulting combined signal as an input signal to said decimation filter; and means for providing compensating delays to said twice-integrated first sigma-delta modulator stage digital output signal and to said once-integrated second sigma-delta modulator stage digital output signal such that the combining thereof with said third sigma-delta modulator stage digital output signal suppresses in said resulting combined signal the quantization noise arising from said first sigma-delta modulator stage and also the quantization noise arising from said second sigma-delta modulator stage.

19. An improved oversampling converter as set forth in claim 15 including:
- a first sigma-delta modulator stage including within a first feedback loop a first integrator followed by a first analog-to-digital converter followed by a first digital-to-analog converter, said first analog-to-digital and first digital-to-analog converters having single-bit resolution;
- a second sigma-delta modulator stage including within a second feedback loop a second integrator followed by a second analog-to-digital converter followed by a second digital-to-analog converter, said second analog-to-digital and second digital-to-analog converters having single-bit resolution;
- a third sigma-delta modulator stage including within a third feedback loop a third integrator followed by a third analog-to-digital converter followed by a third digital-to-analog converter, said third analog-to-digital and third digital-to-analog converters having plural-bit resolution;
- means for applying an analog signal to be digitized by said improved oversampling converter as the analog input signal of said first sigma-delta modulator stage;
- means for supplying the analog input signal of said second sigma-delta modulator stage from said first integrator; and
- means for supplying the analog input signal of said third sigma-delta modulator stage from said second integrator.

20. An improved oversampling converter as set forth in claim 19 including within said means for combining the digital output signals of said plurality of sigma-delta modulator stages:
- means for twice differentiating the digital output signal of said third sigma-delta modulator stage with respect to time, thereby to obtain a twice-differentiated third sigma-delta modulator stage digital output signal;
- means for once differentiating the digital output signal of said second sigma-delta modulator stage with respect to time, thereby to obtain a once-differentiated second sigma-delta modulator stage digital output signal;
- means for combining the digital output signal of said first sigma-delta modulator stage, said once-differentiated second sigma-delta modulator stage digital output signal and said twice-differentiated third sigma-delta modulator stage digital output signal, thereby to generate said resulting combined signal;
- means for applying said resulting combined signal as an input signal to said decimation filter; and
- means for providing compensating delays to said first sigma-delta modulator stage digital output signal and to said once-differentiated second sigma-delta modulator stage digital output signal such that the combining thereof with said twice-differentiated third sigma-delta modulator stage digital output signal suppresses in said resulting combined signal the quantization noise arising from said first sigma-delta modulator stage and also the quantization noise arising from said second sigma-delta modulator stage.

21. An improved oversampling converter as set forth in claim 19 including within said means for combining the digital output signals of said plurality of sigma-delta modulator stages:
- means for twice integrating the digital output signal of said first sigma-delta modulator stage with respect to time, thereby to obtain a twice-integrated first sigma-delta modulator stage digital output signal;
- means for once integrating the digital output signal of said second sigma-delta modulator stage with respect to time, thereby to obtain a once-integrated second sigma-delta modulator stage digital output signal;
- means for combining said twice-integrated first sigma-delta modulator stage digital output signal, said once-integrated second sigma-delta modulator stage digital output signal and said third sigma-delta modulator stage digital output signal, thereby to generate said resulting combined signal;
- means for applying said resulting combined signal as an input signal to said decimation filter; and
- means for providing compensating delays to said twice-integrated first sigma-delta modulator stage digital output signal and to said once-integrated second sigma-delta modulator stage digital output signal such that the combining thereof with said third sigma-delta modulator stage digital output signal suppresses in said resulting combined signal the quantization noise arising from said first sigma-delta modulator stage and also the quantization noise arising from said second sigma-delta modulator stage.

22. An improved oversampling converter as set forth in claim 15 including:
- a first sigma-delta modulator stage including first and second feedback loops, including a first integrator within said first feedback loop, including within both said first and said second feedback loops a second integrator followed by a first analog-to-digital converter followed by a first digital-to-analog converter, said first analog-to-digital and first digital-to-analog converters having single-bit resolution;
- a second sigma-delta modulator stage including within a third feedback loop a third integrator followed by a second analog-to-digital converter followed by a second digital-to-analog converter, said second analog-to-digital and second digital-to-analog converters having plural-bit resolution;
- means for applying an analog signal to be digitized by said improved oversampling converter as the analog input signal of said first sigma-delta modulator stage;
- means for determining the quantization noise of said first sigma-delta modulator stage; and
- means for applying the quantization noise of said first sigma-delta modulator stage to said second sigma-delta modulator stage as the analog input signal thereof.

23. An improved oversampling converter as set forth in claim 22 including within said means for combining the digital output signals of said plurality of sigma-delta modulator stages:
   means for twice differentiating the digital output signal of said second sigma-delta modulator stage with respect to time, thereby to obtain a twice-differentiated second sigma-delta modulator stage digital output signal;
   means for combining the digital output signal of said first sigma-delta modulator stage and said twice-differentiated second sigma-delta modulator stage digital output signal, thereby to generate said resulting combined signal applied to said decimation filter; and
   means for providing compensating delays to said first sigma-delta modulator stage digital output signal such that the combining thereof with said twice-differentiated second sigma-delta modulator stage digital output signal suppresses in said resulting combined signal the quantization noise arising from said first sigma-delta modulator stage.

24. An improved oversampling converter as set forth in claim 22 including within said means for combining the digital output signals of said plurality of sigma-delta modulator stages:
   means for twice integrating the digital output signal of said first sigma-delta modulator stage with respect to time, thereby to obtain a twice-integrated first sigma-delta modulator stage digital output signal;
   means for combining said twice-integrated first sigma-delta modulator stage digital output signal and said second sigma-delta modulator stage digital output signal, thereby to generate said resulting combined signal applied to said decimation filter, and
   means for providing compensating delay to said first sigma-delta modulator stage digital output signal such that the combining thereof with said twice-differentiated second sigma-delta modulator stage digital output signal suppresses in said resulting combined signal the quantization noise arising from said first sigma-delta modulator stage.

25. An improved oversampling converter as set forth in claim 15 including:
   a first sigma-delta modulator stage including first and second feedback loops, including a first integrator within said first feedback loop, including within both said first and said second feedback loops a second integrator followed by a first analog-to-digital converter followed by a first digital-to-analog converter, said first analog-to-digital and first digital-to-analog converters having single-bit resolution;
   a second sigma-delta modulator stage including within a third feedback loop a third integrator followed by a second analog-to-digital converter followed by a second digital-to-analog converter, said second analog-to-digital and second digital-to-analog converters having plural-bit resolution;
   means for applying an analog signal to be digitized by said improved oversampling converter as the analog input signal of said first sigma-delta modulator stage;
   means for supplying the analog input signal of said second sigma-delta modulator stage from said second integrator within said first sigma-delta modulator stage; and, within said means for combining the digital output signals of said plurality of sigma-delta modulator stages,
   means for initially combining the digital output signals of said first and second sigma-delta modulator stages to generate a digital result therefrom; and
   means for providing compensating delay to the digital output signal of said first sigma-delta modulator stage such that the initial combining thereof with the digital output signal of said second sigma-delta modulator stage supresses, in the digital result from said means for initially combining, terms arising from the analog signal to be digitized by said improved oversampling converter.

26. An improved oversampling converter as set forth in claim 25 also including within said means for combining the digital output signals of said plurality of sigma-delta modulator stages:
   means for twice differentiating with respect to time the digital result from said means for initially combining the digital output signals of said first and second sigma-delta modulator stages, thereby to generate a twice-differentiated digital result; and
   means for combining said twice-differentiated digital result with the digital output signal of said first sigma-delta modulator stage signal as provided with said compensating delay, thereby to generate said resulting combined signal in which the quantization noise from said first sigma-delta modulator stage is suppressed.

27. An improved oversampling converter as set forth in claim 25 also including within said means for combining the digital output signals of said plurality of sigma-delta modulator stages:
   means for twice integrating with respect to time the digital output signal of said first sigma-delta modulator stage as provided with said compensating delay, thereby to obtain a twice-integrated delayed first sigma-delta modulator stage digital output signal;
   means for combining said twice-integrated delayed first sigma-delta modulator stage digital output signal with digital result from said means for initially combining the digital output signals of said first and second sigma-delta modulator stages, thereby to generate said resulting combined signal in which the quantization noise from said first sigma-delta modulator stage is suppressed.

28. An improved oversampling converter of a type using a plural-order sigma-delta modulator; said plural-order sigma-delta modulator having a plurality of sigma-delta modulator stages for providing respective digital output signals responsive to their respective analog input signals as respectively reduced by respective analog feed back signals; said improved oversampling converter also of a type including means for combining the digital output signals of said plurality of sigma-delta modulator stages to suppress in a resulting combined signal the quantization noise arising in at least one of said sigma-delta modulator stages, each said sigma-delta modulator stage that has its quantization noise suppressed in said resulting combined signal being referred to hereinafter as a selected one of said sigma-delta modulator stages; said improved oversampling converter also of a type having a decimation filter connected for responding to said resulting combined signal to generate an analog-to-digital conversion result; wherein the improvement comprises: a respective analog-to-digital converter and a respective digital-to-analog converter each having multiple-bit resolution in one of said sigma-delta modulator stages that is other than a said selected one, and a respective analog-to-digital converter and a respective digital-to-analog converter each having less bit resolution than said multiple-bit resolution in each selected one of said sigma-delta modulator stages, the respective analog-to-digital converter in each of said sigma-delta modulator stages generating the respective digital output signal of that stage which is converted to its respective analog feedback signal by the respective digital-to-analog converter of that stage.

29. An improved oversampling converter as set forth in claim 28 wherein the respective analog-to-digital converter the and respective digital-to-analog converter in each of said selected ones of said sigma-delta modulator stages have single-bit resolution.

* * * * *